(12) United States Patent
Kozlowski et al.

(10) Patent No.: US 12,094,688 B2
(45) Date of Patent: Sep. 17, 2024

(54) PLASMA APPARATUS AND METHODS FOR PROCESSING FEED MATERIAL UTILIZING A POWDER INGRESS PREVENTOR (PIP)

(71) Applicant: 6K Inc., North Andover, MA (US)

(72) Inventors: Michael C. Kozlowski, Reading, MA (US); Ed Petersen, Groveland, MA (US); John Colwell, Durham, NH (US); Anthony Andrew, Boston, MA (US)

(73) Assignee: 6K Inc., North Andover, MA (US)

( * ) Notice: Subject to any disclaimer, the term of this patent is extended or adjusted under 35 U.S.C. 154(b) by 0 days.

(21) Appl. No.: 18/451,720

(22) Filed: Aug. 17, 2023

(65) Prior Publication Data
US 2024/0071725 A1 Feb. 29, 2024

Related U.S. Application Data

(60) Provisional application No. 63/373,528, filed on Aug. 25, 2022.

(51) Int. Cl.
*H01J 37/32* (2006.01)

(52) U.S. Cl.
CPC .... *H01J 37/32201* (2013.01); *H01J 37/3244* (2013.01); *H01J 37/32477* (2013.01); *H01J 37/32642* (2013.01); *H01J 2237/327* (2013.01)

(58) Field of Classification Search
None
See application file for complete search history.

(56) References Cited

U.S. PATENT DOCUMENTS

| | | | |
|---|---|---|---|
| 1,699,205 | A | 1/1929 | Emil et al. |
| 2,892,215 | A | 6/1959 | Gerhard et al. |
| 3,290,723 | A | 12/1966 | John et al. |
| 3,293,334 | A | 12/1966 | Bylund et al. |
| 3,434,831 | A | 3/1969 | Knopp |
| 3,466,165 | A | 9/1969 | Rhys et al. |
| RE26,879 | E | 5/1970 | Kelso |
| 3,652,259 | A | 3/1972 | Knopp |
| 3,802,816 | A | 4/1974 | Kaufmann |
| 3,845,344 | A | 10/1974 | Rainer |

(Continued)

FOREIGN PATENT DOCUMENTS

| | | |
|---|---|---|
| AU | 2003211869 A1 | 9/2003 |
| AU | 2014394102 B2 | 6/2020 |

(Continued)

OTHER PUBLICATIONS

"Build Boldly", Technology Demonstration, 6K Additive, [publication date unknown], in 11 pages.

(Continued)

*Primary Examiner* — Srinivas Sathiraju
(74) *Attorney, Agent, or Firm* — Knobbe, Martens, Olson & Bear, LLP

(57) ABSTRACT

Disclosed herein are systems, methods, and devices processing feed material utilizing a microwave plasma apparatus comprising a powder ingress preventor (PIP). In some embodiments, the microwave plasma apparatus comprises a core plasma tube and a liner; and a ring structure comprising: a bearing surface, the bearing surface contacting an interior diameter of the core plasma tube; and an opening, the opening contacting an outer diameter of the liner.

16 Claims, 19 Drawing Sheets

(56) References Cited

U.S. PATENT DOCUMENTS

| | | | |
|---|---|---|---|
| 3,909,241 A | 9/1975 | Cheney et al. | |
| 3,966,374 A | 6/1976 | Honnorat et al. | |
| 3,974,245 A | 8/1976 | Cheney et al. | |
| 4,076,640 A | 2/1978 | Forgensi et al. | |
| 4,177,026 A | 12/1979 | Honnorat et al. | |
| 4,212,837 A | 7/1980 | Kubo et al. | |
| 4,221,554 A | 9/1980 | Oguchi et al. | |
| 4,221,775 A | 9/1980 | Anno | |
| 4,265,730 A | 5/1981 | Hirose et al. | |
| 4,423,303 A | 12/1983 | Hirose et al. | |
| 4,431,449 A | 2/1984 | Dillon et al. | |
| 4,439,410 A | 3/1984 | Santen et al. | |
| 4,544,404 A | 10/1985 | Yolton et al. | |
| 4,569,823 A | 2/1986 | Westin | |
| 4,599,880 A | 7/1986 | Stepanenko et al. | |
| 4,611,108 A | 9/1986 | Leprince et al. | |
| 4,670,047 A | 6/1987 | Kopatz et al. | |
| 4,692,584 A | 9/1987 | Caneer, Jr. | |
| 4,705,560 A | 11/1987 | Kemp et al. | |
| 4,711,660 A | 12/1987 | Kemp et al. | |
| 4,711,661 A | 12/1987 | Kemp et al. | |
| 4,714,587 A | 12/1987 | Eylon et al. | |
| 4,731,110 A | 3/1988 | Kopatz et al. | |
| 4,731,111 A | 3/1988 | Kopatz et al. | |
| 4,772,315 A | 9/1988 | Johnson et al. | |
| 4,778,515 A | 10/1988 | Kemp et al. | |
| 4,780,131 A | 10/1988 | Kemp et al. | |
| 4,783,216 A | 11/1988 | Kemp et al. | |
| 4,783,218 A | 11/1988 | Kemp et al. | |
| 4,787,934 A | 11/1988 | Johnson et al. | |
| 4,802,915 A | 2/1989 | Kopatz et al. | |
| 4,836,850 A | 6/1989 | Kemp et al. | |
| 4,859,237 A | 8/1989 | Johnson et al. | |
| 4,923,509 A | 5/1990 | Kemp et al. | |
| 4,923,531 A | 5/1990 | Fisher | |
| 4,943,322 A | 7/1990 | Kemp et al. | |
| 4,944,797 A | 7/1990 | Kemp et al. | |
| 4,952,389 A | 8/1990 | Szymanski et al. | |
| 5,022,935 A | 6/1991 | Fisher | |
| 5,032,202 A * | 7/1991 | Tsai | H01J 37/32706 315/111.41 |
| 5,041,713 A | 8/1991 | Weidman | |
| 5,095,048 A | 3/1992 | Takahashi et al. | |
| 5,114,471 A | 5/1992 | Johnson et al. | |
| 5,131,992 A | 7/1992 | Church et al. | |
| 5,200,595 A | 4/1993 | Boulos et al. | |
| 5,234,526 A * | 8/1993 | Chen | H01J 37/32192 118/252 |
| 5,290,507 A | 3/1994 | Runkle | |
| 5,292,370 A | 3/1994 | Tsai et al. | |
| 5,370,765 A * | 12/1994 | Dandl | H01J 37/32678 427/571 |
| 5,376,475 A | 12/1994 | Ovshinsky et al. | |
| 5,395,453 A | 3/1995 | Noda | |
| 5,411,592 A | 5/1995 | Ovshinsky et al. | |
| 5,431,967 A | 7/1995 | Manthiram et al. | |
| 5,518,831 A | 5/1996 | Tou et al. | |
| 5,567,243 A * | 10/1996 | Foster | C23C 16/455 118/723 MR |
| 5,665,640 A * | 9/1997 | Foster | C23C 16/45565 427/575 |
| 5,671,045 A | 9/1997 | Woskov et al. | |
| 5,676,919 A | 10/1997 | Kawamura et al. | |
| 5,750,013 A | 5/1998 | Lin | |
| 5,776,323 A | 7/1998 | Kobashi | |
| 5,866,213 A * | 2/1999 | Foster | H01L 21/28556 427/573 |
| 5,876,684 A * | 3/1999 | Withers | C01B 32/15 204/173 |
| 5,909,277 A | 6/1999 | Woskov et al. | |
| 5,958,361 A | 9/1999 | Laine et al. | |
| 5,969,352 A * | 10/1999 | French | H01J 49/105 250/288 |
| 5,980,977 A | 11/1999 | Deng et al. | |
| 5,989,648 A | 11/1999 | Phillips | |
| 6,027,585 A | 2/2000 | Patterson et al. | |
| 6,200,651 B1 | 3/2001 | Roche et al. | |
| 6,221,125 B1 | 4/2001 | Soda et al. | |
| 6,261,484 B1 | 7/2001 | Phillips et al. | |
| 6,274,110 B1 | 8/2001 | Kim et al. | |
| 6,329,628 B1 | 12/2001 | Kuo et al. | |
| 6,334,882 B1 | 1/2002 | Aaslund | |
| 6,362,449 B1 | 3/2002 | Hadidi et al. | |
| 6,376,027 B1 | 4/2002 | Lee et al. | |
| 6,409,851 B1 | 6/2002 | Sethuram et al. | |
| 6,428,600 B1 | 8/2002 | Flurschuetz et al. | |
| 6,543,380 B1 | 4/2003 | Sung-Spitzl | |
| 6,551,377 B1 | 4/2003 | Leonhardt | |
| 6,569,397 B1 | 5/2003 | Yadav et al. | |
| 6,579,573 B2 | 6/2003 | Strutt et al. | |
| 6,589,311 B1 | 7/2003 | Han et al. | |
| 6,607,693 B1 | 8/2003 | Saito et al. | |
| 6,652,822 B2 | 11/2003 | Phillips et al. | |
| 6,676,728 B2 | 1/2004 | Han et al. | |
| 6,689,192 B1 | 2/2004 | Phillips et al. | |
| 6,752,979 B1 | 6/2004 | Talbot et al. | |
| 6,755,886 B2 | 6/2004 | Phillips et al. | |
| 6,780,219 B2 | 8/2004 | Singh et al. | |
| 6,793,849 B1 | 9/2004 | Gruen et al. | |
| 6,805,822 B2 | 10/2004 | Takei et al. | |
| 6,838,072 B1 | 1/2005 | Kong et al. | |
| 6,869,550 B2 | 3/2005 | Dorfman et al. | |
| 6,902,745 B2 | 6/2005 | Lee et al. | |
| 6,919,257 B2 | 7/2005 | Gealy et al. | |
| 6,919,527 B2 | 7/2005 | Boulos et al. | |
| 6,989,529 B2 | 1/2006 | Wiseman | |
| 7,066,980 B2 | 6/2006 | Akimoto et al. | |
| 7,091,441 B1 | 8/2006 | Kuo | |
| 7,108,733 B2 | 9/2006 | Enokido | |
| 7,125,537 B2 | 10/2006 | Liao et al. | |
| 7,125,822 B2 | 10/2006 | Nakano et al. | |
| 7,175,786 B2 | 2/2007 | Celikkaya et al. | |
| 7,182,929 B1 | 2/2007 | Singhal et al. | |
| 7,220,398 B2 | 5/2007 | Sutorik et al. | |
| 7,235,118 B2 | 6/2007 | Bouaricha et al. | |
| 7,285,194 B2 | 10/2007 | Uno et al. | |
| 7,285,307 B2 | 10/2007 | Hohenthanner et al. | |
| 7,297,310 B1 | 11/2007 | Peng et al. | |
| 7,297,892 B2 | 11/2007 | Kelley et al. | |
| 7,344,776 B2 | 3/2008 | Kollmann et al. | |
| 7,357,910 B2 | 4/2008 | Phillips et al. | |
| 7,368,130 B2 | 5/2008 | Kim et al. | |
| 7,374,704 B2 | 5/2008 | Che et al. | |
| 7,375,303 B2 | 5/2008 | Twarog | |
| 7,381,496 B2 | 6/2008 | Onnerud et al. | |
| 7,431,750 B2 | 10/2008 | Liao et al. | |
| 7,442,271 B2 | 10/2008 | Asmussen et al. | |
| 7,491,468 B2 | 2/2009 | Okada et al. | |
| 7,517,513 B2 | 4/2009 | Sarkas et al. | |
| 7,524,353 B2 | 4/2009 | Johnson et al. | |
| 7,534,296 B2 | 5/2009 | Swain et al. | |
| 7,572,315 B2 | 8/2009 | Boulos et al. | |
| 7,622,211 B2 | 11/2009 | Vyas et al. | |
| 7,629,553 B2 | 12/2009 | Fanson et al. | |
| 7,700,152 B2 | 4/2010 | Laine et al. | |
| 7,776,303 B2 | 8/2010 | Hung et al. | |
| 7,806,077 B2 | 10/2010 | Lee et al. | |
| 7,828,999 B2 | 11/2010 | Yubuta et al. | |
| 7,901,658 B2 | 3/2011 | Weppner et al. | |
| 7,931,836 B2 | 4/2011 | Xie et al. | |
| 7,939,141 B2 | 5/2011 | Matthews et al. | |
| 8,007,691 B2 | 8/2011 | Sawaki et al. | |
| 8,043,405 B2 | 10/2011 | Johnson et al. | |
| 8,092,941 B2 | 1/2012 | Weppner et al. | |
| 8,101,061 B2 | 1/2012 | Suh et al. | |
| 8,168,128 B2 | 5/2012 | Seeley et al. | |
| 8,178,240 B2 | 5/2012 | Wang et al. | |
| 8,192,865 B2 | 6/2012 | Buiel et al. | |
| 8,193,291 B2 | 6/2012 | Zhang | |
| 8,211,388 B2 | 7/2012 | Woodfield et al. | |
| 8,268,230 B2 | 9/2012 | Cherepy et al. | |
| 8,283,275 B2 | 10/2012 | Heo et al. | |
| 8,303,926 B1 | 11/2012 | Luhrs et al. | |

(56) References Cited

U.S. PATENT DOCUMENTS

| | | |
|---|---|---|
| 8,329,090 B2 | 12/2012 | Hollingsworth et al. |
| 8,329,257 B2 | 12/2012 | Larouche et al. |
| 8,338,323 B2 | 12/2012 | Takasu et al. |
| 8,389,160 B2 | 3/2013 | Venkatachalam et al. |
| 8,420,043 B2 | 4/2013 | Gamo et al. |
| 8,439,998 B2 | 5/2013 | Ito et al. |
| 8,449,950 B2 | 5/2013 | Shang et al. |
| 8,478,785 B2 | 7/2013 | Jamjoom et al. |
| 8,492,303 B2 | 7/2013 | Bulan et al. |
| 8,529,996 B2 | 9/2013 | Bocian et al. |
| 8,592,767 B2 | 11/2013 | Rappe et al. |
| 8,597,722 B2 | 12/2013 | Albano et al. |
| 8,623,555 B2 | 1/2014 | Kang et al. |
| 8,658,317 B2 | 2/2014 | Weppner et al. |
| 8,685,593 B2 | 4/2014 | Dadheech et al. |
| 8,728,680 B2 | 5/2014 | Mikhail et al. |
| 8,735,022 B2 | 5/2014 | Schlag et al. |
| 8,748,785 B2 | 6/2014 | Jordan et al. |
| 8,758,957 B2 | 6/2014 | Dadheech et al. |
| 8,784,706 B2 | 7/2014 | Shevchenko et al. |
| 8,822,000 B2 | 9/2014 | Kumagai et al. |
| 8,840,701 B2 | 9/2014 | Borland et al. |
| 8,877,119 B2 | 11/2014 | Jordan et al. |
| 8,911,529 B2 | 12/2014 | Withers et al. |
| 8,919,428 B2 | 12/2014 | Cola et al. |
| 8,945,431 B2 | 2/2015 | Schulz et al. |
| 8,951,496 B2 | 2/2015 | Hadidi et al. |
| 8,956,785 B2 | 2/2015 | Dadheech et al. |
| 8,968,587 B2 | 3/2015 | Shin et al. |
| 8,968,669 B2 | 3/2015 | Chen |
| 8,980,485 B2 | 3/2015 | Lanning et al. |
| 8,999,440 B2 | 4/2015 | Zenasni et al. |
| 9,023,259 B2 | 5/2015 | Hadidi et al. |
| 9,051,647 B2 | 6/2015 | Cooperberg et al. |
| 9,065,141 B2 | 6/2015 | Merzougui et al. |
| 9,067,264 B2 | 6/2015 | Moxson et al. |
| 9,079,778 B2 | 7/2015 | Kelley et al. |
| 9,085,490 B2 | 7/2015 | Taylor et al. |
| 9,101,982 B2 | 8/2015 | Aslund |
| 9,136,569 B2 | 9/2015 | Song et al. |
| 9,150,422 B2 | 10/2015 | Nakayama et al. |
| 9,193,133 B2 | 11/2015 | Shin et al. |
| 9,196,901 B2 | 11/2015 | Se-Hee et al. |
| 9,196,905 B2 | 11/2015 | Tzeng et al. |
| 9,206,085 B2 | 12/2015 | Hadidi et al. |
| 9,242,224 B2 | 1/2016 | Redjdal et al. |
| 9,259,785 B2 | 2/2016 | Hadidi et al. |
| 9,293,302 B2 | 3/2016 | Risby et al. |
| 9,321,071 B2 | 4/2016 | Jordan et al. |
| 9,322,081 B2 | 4/2016 | McHugh et al. |
| 9,352,278 B2 | 5/2016 | Spatz et al. |
| 9,356,281 B2 | 5/2016 | Verbrugge et al. |
| 9,368,772 B1 | 6/2016 | Chen et al. |
| 9,378,928 B2 * | 6/2016 | Zeng ............... H01J 37/32568 |
| 9,412,998 B2 | 8/2016 | Rojeski et al. |
| 9,421,612 B2 | 8/2016 | Fang et al. |
| 9,425,463 B2 | 8/2016 | Hsu et al. |
| 9,463,435 B2 | 10/2016 | Schulz et al. |
| 9,463,984 B2 | 10/2016 | Sun et al. |
| 9,520,593 B2 | 12/2016 | Sun et al. |
| 9,520,600 B2 | 12/2016 | Dadheech et al. |
| 9,624,565 B2 | 4/2017 | Lee et al. |
| 9,630,162 B1 | 4/2017 | Sunkara et al. |
| 9,643,891 B2 | 5/2017 | Hadidi et al. |
| 9,700,877 B2 | 7/2017 | Kim et al. |
| 9,705,136 B2 | 7/2017 | Rojeski |
| 9,718,131 B2 | 8/2017 | Boulos et al. |
| 9,735,427 B2 | 8/2017 | Zhang |
| 9,738,788 B1 | 8/2017 | Gross et al. |
| 9,751,129 B2 | 9/2017 | Boulos et al. |
| 9,767,990 B2 * | 9/2017 | Zeng ............... H01J 37/32844 |
| 9,768,033 B2 | 9/2017 | Ranjan et al. |
| 9,776,378 B2 | 10/2017 | Choi |
| 9,782,791 B2 | 10/2017 | Redjdal et al. |
| 9,782,828 B2 | 10/2017 | Wilkinson |
| 9,796,019 B2 | 10/2017 | She et al. |
| 9,796,020 B2 | 10/2017 | Aslund |
| 9,831,503 B2 | 11/2017 | Sopchak |
| 9,871,248 B2 | 1/2018 | Rayner et al. |
| 9,879,344 B2 | 1/2018 | Lee et al. |
| 9,899,674 B2 | 2/2018 | Hirai et al. |
| 9,917,299 B2 | 3/2018 | Behan et al. |
| 9,932,673 B2 | 4/2018 | Jordan et al. |
| 9,945,034 B2 | 4/2018 | Yao et al. |
| 9,945,564 B2 | 4/2018 | Gao et al. |
| 9,947,926 B2 | 4/2018 | Kim et al. |
| 9,981,284 B2 | 5/2018 | Guo et al. |
| 9,991,458 B2 | 6/2018 | Rosenman et al. |
| 9,999,922 B1 | 6/2018 | Struve |
| 10,011,491 B2 | 7/2018 | Lee et al. |
| 10,050,303 B2 | 8/2018 | Anandan et al. |
| 10,057,986 B2 | 8/2018 | Prud'Homme et al. |
| 10,065,240 B2 | 9/2018 | Chen |
| 10,079,392 B2 | 9/2018 | Huang et al. |
| 10,116,000 B1 | 10/2018 | Federici et al. |
| 10,130,994 B2 | 11/2018 | Fang et al. |
| 10,167,556 B2 | 1/2019 | Ruzic et al. |
| 10,170,753 B2 | 1/2019 | Ren et al. |
| 10,193,142 B2 | 1/2019 | Rojeski |
| 10,244,614 B2 | 3/2019 | Foret |
| 10,279,531 B2 | 5/2019 | Pagliarini |
| 10,283,757 B2 | 5/2019 | Noh et al. |
| 10,319,537 B2 | 6/2019 | Claussen et al. |
| 10,333,183 B2 | 6/2019 | Sloop |
| 10,350,680 B2 | 7/2019 | Yamamoto et al. |
| 10,403,475 B2 | 9/2019 | Cooperberg et al. |
| 10,411,253 B2 | 9/2019 | Tzeng et al. |
| 10,439,206 B2 | 10/2019 | Behan et al. |
| 10,442,000 B2 | 10/2019 | Fukada et al. |
| 10,461,298 B2 | 10/2019 | Herle |
| 10,477,665 B2 | 11/2019 | Hadidi et al. |
| 10,493,524 B2 | 12/2019 | She et al. |
| 10,522,300 B2 | 12/2019 | Yang |
| 10,526,684 B2 | 1/2020 | Ekman et al. |
| 10,529,486 B2 | 1/2020 | Nishisaka |
| 10,543,534 B2 | 1/2020 | Hadidi et al. |
| 10,584,923 B2 * | 3/2020 | de Bock ............... F28F 3/04 |
| 10,593,985 B2 | 3/2020 | Sastry et al. |
| 10,610,929 B2 | 4/2020 | Fang et al. |
| 10,637,029 B2 | 4/2020 | Gotlib Vainshtein et al. |
| 10,638,592 B2 | 4/2020 | Foret |
| 10,639,712 B2 * | 5/2020 | Barnes ............... B22F 1/142 |
| 10,647,824 B2 | 5/2020 | Hwang et al. |
| 10,655,206 B2 | 5/2020 | Moon et al. |
| 10,665,890 B2 | 5/2020 | Kang et al. |
| 10,668,566 B2 | 6/2020 | Smathers et al. |
| 10,669,437 B2 | 6/2020 | Cox et al. |
| 10,688,564 B2 | 6/2020 | Boulos et al. |
| 10,707,477 B2 | 7/2020 | Sastry et al. |
| 10,717,150 B2 | 7/2020 | Aleksandrov et al. |
| 10,727,477 B2 | 7/2020 | Kim et al. |
| 10,741,845 B2 | 8/2020 | Yushin et al. |
| 10,744,590 B2 | 8/2020 | Maier et al. |
| 10,756,334 B2 | 8/2020 | Stowell et al. |
| 10,766,787 B1 | 9/2020 | Sunkara et al. |
| 10,777,804 B2 | 9/2020 | Sastry et al. |
| 10,858,255 B2 | 12/2020 | Koziol et al. |
| 10,858,500 B2 | 12/2020 | Chen et al. |
| 10,892,477 B2 | 1/2021 | Choi et al. |
| 10,930,473 B2 | 2/2021 | Paukner et al. |
| 10,930,922 B2 | 2/2021 | Sun et al. |
| 10,937,632 B2 | 3/2021 | Stowell et al. |
| 10,943,744 B2 | 3/2021 | Sungail et al. |
| 10,944,093 B2 | 3/2021 | Paz et al. |
| 10,950,856 B2 | 3/2021 | Park et al. |
| 10,964,938 B2 | 3/2021 | Rojeski |
| 10,987,735 B2 | 4/2021 | Hadidi et al. |
| 10,998,552 B2 | 5/2021 | Lanning et al. |
| 11,011,388 B2 * | 5/2021 | Eason ............... H01J 37/321 |
| 11,031,641 B2 | 6/2021 | Gupta et al. |
| 11,050,061 B2 | 6/2021 | Kim et al. |
| 11,072,533 B2 | 7/2021 | Shevchenko et al. |
| 11,077,497 B2 | 8/2021 | Motchenbacher et al. |
| 11,077,524 B2 | 8/2021 | Smathers et al. |

(56) References Cited

U.S. PATENT DOCUMENTS

| | | |
|---|---|---|
| 11,108,050 B2 | 8/2021 | Kim et al. |
| 11,116,000 B2 | 9/2021 | Sandberg et al. |
| 11,130,175 B2 | 9/2021 | Parrish et al. |
| 11,130,994 B2 | 9/2021 | Shachar et al. |
| 11,133,495 B2 | 9/2021 | Gazda et al. |
| 11,148,202 B2 | 10/2021 | Hadidi et al. |
| 11,167,556 B2 | 11/2021 | Shimada et al. |
| 11,170,753 B2 | 11/2021 | Nomura et al. |
| 11,171,322 B2 | 11/2021 | Seol et al. |
| 11,183,682 B2 | 11/2021 | Sunkara et al. |
| 11,193,142 B2 | 12/2021 | Angelidaki et al. |
| 11,196,045 B2 | 12/2021 | Dadheech et al. |
| 11,219,884 B2 | 1/2022 | Takeda et al. |
| 11,244,614 B2 | 2/2022 | He et al. |
| 11,245,065 B1 | 2/2022 | Ouderkirk et al. |
| 11,245,109 B2 | 2/2022 | Tzeng et al. |
| 11,254,585 B2 | 2/2022 | Ekman et al. |
| 11,273,322 B2 | 3/2022 | Zanata et al. |
| 11,273,491 B2 * | 3/2022 | Barnes ............... B22F 9/14 |
| 11,299,397 B2 | 4/2022 | Lanning et al. |
| 11,311,937 B2 | 4/2022 | Hadidi et al. |
| 11,311,938 B2 | 4/2022 | Badwe et al. |
| 11,319,537 B2 | 5/2022 | Dames et al. |
| 11,333,183 B2 | 5/2022 | Desai et al. |
| 11,335,911 B2 | 5/2022 | Lanning et al. |
| 11,350,680 B2 | 6/2022 | Rutkoski et al. |
| 11,411,253 B2 | 8/2022 | Busacca et al. |
| 11,439,206 B2 | 9/2022 | Santos |
| 11,442,000 B2 | 9/2022 | Vaez-Iravani et al. |
| 11,461,298 B1 | 10/2022 | Shemmer et al. |
| 11,465,201 B2 * | 10/2022 | Barnes ............... B33Y 70/00 |
| 11,471,941 B2 * | 10/2022 | Barnes ............... C22C 19/07 |
| 11,477,665 B2 | 10/2022 | Franke et al. |
| 11,577,314 B2 | 2/2023 | Hadidi et al. |
| 11,590,568 B2 | 2/2023 | Badwe et al. |
| 11,611,130 B2 | 3/2023 | Wrobel et al. |
| 11,633,785 B2 | 4/2023 | Badwe et al. |
| 11,654,483 B2 | 5/2023 | Larouche et al. |
| 11,717,886 B2 | 8/2023 | Badwe et al. |
| 11,839,919 B2 | 12/2023 | Hadidi et al. |
| 11,855,278 B2 | 12/2023 | Holman et al. |
| 11,919,071 B2 | 3/2024 | Badwe et al. |
| 11,923,176 B2 | 3/2024 | Stowell et al. |
| 11,963,287 B2 | 4/2024 | Shang et al. |
| 2001/0016283 A1 | 8/2001 | Shiraishi et al. |
| 2001/0021740 A1 | 9/2001 | Lodyga et al. |
| 2002/0054912 A1 | 5/2002 | Kim et al. |
| 2002/0112794 A1 | 8/2002 | Sethuram et al. |
| 2003/0024806 A1 | 2/2003 | Foret |
| 2003/0027021 A1 | 2/2003 | Sharivker et al. |
| 2003/0070620 A1 | 4/2003 | Cooperberg et al. |
| 2003/0077398 A1 | 4/2003 | Strutt et al. |
| 2003/0129497 A1 | 7/2003 | Yamamoto et al. |
| 2003/0172772 A1 | 9/2003 | Sethuram et al. |
| 2003/0186128 A1 | 10/2003 | Singh et al. |
| 2003/0207978 A1 | 11/2003 | Yadav et al. |
| 2004/0013941 A1 | 1/2004 | Kobayashi et al. |
| 2004/0045807 A1 | 3/2004 | Sarkas et al. |
| 2004/0060387 A1 | 4/2004 | Tanner-Jones |
| 2004/0123699 A1 | 7/2004 | Liao et al. |
| 2004/0247522 A1 * | 12/2004 | Mills ............... C23C 16/27 423/648.1 |
| 2005/0005844 A1 | 1/2005 | Kitagawa et al. |
| 2005/0025698 A1 | 2/2005 | Talbot et al. |
| 2005/0072496 A1 | 4/2005 | Hwang et al. |
| 2005/0163696 A1 | 7/2005 | Uhm et al. |
| 2005/0242070 A1 | 11/2005 | Hammer |
| 2005/0260786 A1 | 11/2005 | Yoshikawa et al. |
| 2006/0040168 A1 | 2/2006 | Sridhar |
| 2006/0141153 A1 | 6/2006 | Kubota et al. |
| 2006/0145124 A1 | 7/2006 | Hsiao et al. |
| 2006/0291827 A1 | 12/2006 | Suib et al. |
| 2007/0077350 A1 | 4/2007 | Hohenthanner et al. |
| 2007/0089860 A1 | 4/2007 | Hou et al. |
| 2007/0092432 A1 * | 4/2007 | Prud'Homme ....... C01B 32/225 423/448 |
| 2007/0209758 A1 | 9/2007 | Sompalli et al. |
| 2007/0221635 A1 | 9/2007 | Boulos et al. |
| 2007/0259768 A1 | 11/2007 | Kear et al. |
| 2008/0029485 A1 | 2/2008 | Kelley et al. |
| 2008/0055594 A1 | 3/2008 | Hadidi et al. |
| 2008/0182114 A1 | 7/2008 | Kim et al. |
| 2008/0220244 A1 | 9/2008 | Wai et al. |
| 2008/0286490 A1 | 11/2008 | Bogdanoff et al. |
| 2008/0296268 A1 | 12/2008 | Mike et al. |
| 2008/0305025 A1 | 12/2008 | Mtner et al. |
| 2009/0074655 A1 | 3/2009 | Suciu |
| 2009/0093553 A1 | 4/2009 | Kleine et al. |
| 2009/0155689 A1 | 6/2009 | Zaghib et al. |
| 2009/0196801 A1 * | 8/2009 | Mills ............... G21B 3/00 422/186 |
| 2009/0202869 A1 | 8/2009 | Sawaki et al. |
| 2009/0258255 A1 | 10/2009 | Terashima et al. |
| 2009/0266487 A1 | 10/2009 | Tian et al. |
| 2009/0304941 A1 | 12/2009 | McLean |
| 2009/0305132 A1 | 12/2009 | Gauthier et al. |
| 2010/0007162 A1 | 1/2010 | Han et al. |
| 2010/0096362 A1 | 4/2010 | Hirayama et al. |
| 2010/0176524 A1 | 7/2010 | Burgess et al. |
| 2010/0219062 A1 | 9/2010 | Leon Sanchez |
| 2011/0005461 A1 | 1/2011 | Vandermeulen |
| 2011/0006254 A1 | 1/2011 | Richard et al. |
| 2012/0015284 A1 | 1/2012 | Merzougui et al. |
| 2012/0027955 A1 | 2/2012 | Sunkara et al. |
| 2012/0034135 A1 | 2/2012 | Risby |
| 2012/0048064 A1 | 3/2012 | Kasper et al. |
| 2012/0051962 A1 | 3/2012 | Imam et al. |
| 2012/0074342 A1 | 3/2012 | Kim et al. |
| 2012/0100438 A1 | 4/2012 | Fasching et al. |
| 2012/0112379 A1 | 5/2012 | Beppu et al. |
| 2012/0122017 A1 | 5/2012 | Mills |
| 2012/0224175 A1 | 9/2012 | Minghetti |
| 2012/0230860 A1 | 9/2012 | Ward-Close et al. |
| 2012/0240726 A1 | 9/2012 | Kim et al. |
| 2012/0294919 A1 | 11/2012 | Jaynes et al. |
| 2013/0032753 A1 | 2/2013 | Yamamoto et al. |
| 2013/0071284 A1 | 3/2013 | Kano et al. |
| 2013/0075390 A1 | 3/2013 | Ashida |
| 2013/0078508 A1 | 3/2013 | Tolbert et al. |
| 2013/0084474 A1 | 4/2013 | Mills |
| 2013/0087285 A1 | 4/2013 | Kofuji et al. |
| 2014/0048516 A1 | 2/2014 | Gorodetsky et al. |
| 2014/0202286 A1 | 7/2014 | Yokoyama et al. |
| 2014/0271843 A1 * | 9/2014 | Ma ............... A61K 9/0024 424/463 |
| 2014/0272430 A1 | 9/2014 | Kalayaraman |
| 2014/0322632 A1 | 10/2014 | Sugimoto et al. |
| 2014/0373344 A1 | 12/2014 | Takada et al. |
| 2015/0000844 A1 | 1/2015 | Woo |
| 2015/0101454 A1 | 4/2015 | Shimizu et al. |
| 2015/0167143 A1 | 6/2015 | Luce et al. |
| 2015/0171455 A1 | 6/2015 | Mills |
| 2015/0255767 A1 | 9/2015 | Aetukuri et al. |
| 2015/0259220 A1 | 9/2015 | Rosocha et al. |
| 2015/0270106 A1 | 9/2015 | Kobayashi et al. |
| 2015/0333307 A1 | 11/2015 | Thokchom et al. |
| 2015/0342491 A1 * | 12/2015 | Marecki ............... A61B 18/1492 600/374 |
| 2015/0348754 A1 * | 12/2015 | Zeng ............... H01J 37/32844 315/34 |
| 2015/0351652 A1 * | 12/2015 | Marecki ............... A61B 18/1492 29/829 |
| 2016/0028088 A1 | 1/2016 | Romeo et al. |
| 2016/0030359 A1 * | 2/2016 | Ma ............... A61K 9/5036 264/10 |
| 2016/0045841 A1 | 2/2016 | Kaplan et al. |
| 2016/0152480 A1 | 6/2016 | Jang et al. |
| 2016/0172163 A1 | 6/2016 | Kaneko et al. |
| 2016/0189933 A1 | 6/2016 | Kobayashi et al. |
| 2016/0197341 A1 | 7/2016 | Lu et al. |
| 2016/0254540 A1 | 9/2016 | Lee et al. |
| 2016/0284519 A1 | 9/2016 | Kobayashi et al. |
| 2016/0285090 A1 | 9/2016 | Ozkan et al. |

(56) References Cited

U.S. PATENT DOCUMENTS

| | | | |
|---|---|---|---|
| 2016/0287113 A1 | 10/2016 | Hebert et al. | |
| 2016/0300692 A1* | 10/2016 | Zeng | H01J 37/32522 |
| 2016/0308244 A1 | 10/2016 | Badding et al. | |
| 2016/0332232 A1 | 11/2016 | Forbes et al. | |
| 2016/0351910 A1 | 12/2016 | Albano et al. | |
| 2016/0358757 A1 | 12/2016 | Ikeda et al. | |
| 2017/0009328 A1 | 1/2017 | Germann et al. | |
| 2017/0070180 A1 | 3/2017 | Mills | |
| 2017/0113935 A1 | 4/2017 | Pennington et al. | |
| 2017/0120339 A1 | 5/2017 | Aslund | |
| 2017/0125842 A1 | 5/2017 | Meguro et al. | |
| 2017/0151609 A1 | 6/2017 | Elsen et al. | |
| 2017/0176977 A1 | 6/2017 | Huang et al. | |
| 2017/0179477 A1 | 6/2017 | Walters et al. | |
| 2017/0209922 A1 | 7/2017 | Kato et al. | |
| 2017/0338464 A1 | 11/2017 | Fasching et al. | |
| 2017/0368604 A1 | 12/2017 | Wilkinson | |
| 2017/0373344 A1 | 12/2017 | Hadidi et al. | |
| 2018/0022928 A1 | 1/2018 | Blush | |
| 2018/0025794 A1 | 1/2018 | Lahoda et al. | |
| 2018/0083264 A1 | 3/2018 | Soppe | |
| 2018/0104745 A1 | 4/2018 | L'Esperance et al. | |
| 2018/0114677 A1 | 4/2018 | Komatsu et al. | |
| 2018/0130638 A1 | 5/2018 | Ahmad et al. | |
| 2018/0134629 A1* | 5/2018 | Kolios | C04B 37/008 |
| 2018/0138018 A1 | 5/2018 | Voronin et al. | |
| 2018/0159178 A1 | 6/2018 | Weisenstein et al. | |
| 2018/0169763 A1 | 6/2018 | Dorval et al. | |
| 2018/0214956 A1 | 8/2018 | Larouche et al. | |
| 2018/0218883 A1 | 8/2018 | Iwao | |
| 2018/0241956 A1 | 8/2018 | Suzuki | |
| 2018/0248175 A1 | 8/2018 | Ghezelbash et al. | |
| 2018/0277826 A1 | 9/2018 | Gayden et al. | |
| 2018/0277849 A1 | 9/2018 | Gayden | |
| 2018/0294143 A1 | 10/2018 | Chua et al. | |
| 2018/0346344 A1 | 12/2018 | Chen et al. | |
| 2018/0353643 A1* | 12/2018 | Ma | A61L 27/52 |
| 2018/0363104 A1 | 12/2018 | Fujieda et al. | |
| 2018/0366707 A1 | 12/2018 | Johnson et al. | |
| 2018/0375149 A1 | 12/2018 | Beck et al. | |
| 2019/0001416 A1 | 1/2019 | Larouche et al. | |
| 2019/0061005 A1 | 2/2019 | Kelkar | |
| 2019/0069944 A1 | 3/2019 | Fischer | |
| 2019/0084290 A1 | 3/2019 | Stoyanov et al. | |
| 2019/0088993 A1 | 3/2019 | Ohta | |
| 2019/0125842 A1 | 5/2019 | Grabowski | |
| 2019/0127835 A1 | 5/2019 | Yang et al. | |
| 2019/0157045 A1 | 5/2019 | Meloni | |
| 2019/0160528 A1 | 5/2019 | Mcgee et al. | |
| 2019/0165413 A1 | 5/2019 | Furusawa | |
| 2019/0173130 A1 | 6/2019 | Schuhmacher et al. | |
| 2019/0193151 A1 | 6/2019 | Okumura et al. | |
| 2019/0218650 A1 | 7/2019 | Subramanian et al. | |
| 2019/0271068 A1 | 9/2019 | Sungail et al. | |
| 2019/0292441 A1 | 9/2019 | Hill et al. | |
| 2019/0334206 A1 | 10/2019 | Sastry et al. | |
| 2019/0341650 A9 | 11/2019 | Lanning et al. | |
| 2019/0348202 A1 | 11/2019 | Sachdev et al. | |
| 2019/0362936 A1 | 11/2019 | Van Den Berg et al. | |
| 2019/0381564 A1* | 12/2019 | Barnes | C22C 19/07 |
| 2019/0389734 A1 | 12/2019 | Dietz et al. | |
| 2020/0067128 A1 | 2/2020 | Chmiola et al. | |
| 2020/0136176 A1 | 4/2020 | Chen | |
| 2020/0149146 A1 | 5/2020 | Chen et al. | |
| 2020/0153037 A1 | 5/2020 | Renna et al. | |
| 2020/0187607 A1 | 6/2020 | Law | |
| 2020/0198977 A1 | 6/2020 | Hof et al. | |
| 2020/0203706 A1 | 6/2020 | Holman et al. | |
| 2020/0207668 A1 | 7/2020 | Cavalli et al. | |
| 2020/0215606 A1* | 7/2020 | Barnes | B22F 1/142 |
| 2020/0220222 A1 | 7/2020 | Watarai et al. | |
| 2020/0223704 A1 | 7/2020 | Neale et al. | |
| 2020/0227728 A1 | 7/2020 | Huang et al. | |
| 2020/0254432 A1 | 8/2020 | Shirman et al. | |
| 2020/0276638 A1 | 9/2020 | King et al. | |
| 2020/0288561 A1 | 9/2020 | Huh | |
| 2020/0314991 A1* | 10/2020 | Duanmu | B23K 37/003 |
| 2020/0335754 A1 | 10/2020 | Ramasubramanian et al. | |
| 2020/0335781 A1 | 10/2020 | Oshita et al. | |
| 2020/0350565 A1 | 11/2020 | Oshita et al. | |
| 2020/0358093 A1 | 11/2020 | Oshita et al. | |
| 2020/0358096 A1 | 11/2020 | Paulsen et al. | |
| 2020/0381217 A1 | 12/2020 | Kraus et al. | |
| 2020/0388857 A1 | 12/2020 | Sunkara et al. | |
| 2020/0391295 A1 | 12/2020 | Dorval et al. | |
| 2020/0395607 A1 | 12/2020 | Tzeng | |
| 2020/0403236 A1* | 12/2020 | Colwell | B01J 8/085 |
| 2020/0407858 A1 | 12/2020 | Sano et al. | |
| 2021/0002759 A1 | 1/2021 | Zhang et al. | |
| 2021/0024358 A1 | 1/2021 | Chae et al. | |
| 2021/0047186 A1 | 2/2021 | Ifuku et al. | |
| 2021/0057191 A1 | 2/2021 | Stowell et al. | |
| 2021/0075000 A1 | 3/2021 | Holman et al. | |
| 2021/0078072 A1* | 3/2021 | Barnes | B22F 1/065 |
| 2021/0085468 A1 | 3/2021 | Ryd et al. | |
| 2021/0098826 A1 | 4/2021 | Chung et al. | |
| 2021/0129216 A1* | 5/2021 | Barnes | C22C 19/07 |
| 2021/0139331 A1 | 5/2021 | Kang et al. | |
| 2021/0187614 A1 | 6/2021 | Tsubota et al. | |
| 2021/0226302 A1 | 7/2021 | Lanning et al. | |
| 2021/0253430 A1 | 8/2021 | Zaplotnik et al. | |
| 2021/0273217 A1 | 9/2021 | Park et al. | |
| 2021/0273292 A1 | 9/2021 | Yun et al. | |
| 2021/0276094 A1 | 9/2021 | Sobu et al. | |
| 2021/0296731 A1 | 9/2021 | Wrobel et al. | |
| 2021/0310110 A1 | 10/2021 | Stowell et al. | |
| 2021/0339313 A1 | 11/2021 | Motchenbacher et al. | |
| 2021/0344059 A1 | 11/2021 | Ekman et al. | |
| 2021/0367264 A1 | 11/2021 | Hadidi et al. | |
| 2022/0041457 A1 | 2/2022 | Pullen et al. | |
| 2022/0063012 A1 | 3/2022 | Murata et al. | |
| 2022/0127145 A1 | 4/2022 | Ding et al. | |
| 2022/0134430 A1 | 5/2022 | Larouche et al. | |
| 2022/0143693 A1 | 5/2022 | Larouche et al. | |
| 2022/0209298 A1 | 6/2022 | Kim et al. | |
| 2022/0223379 A1* | 7/2022 | Holman | H01M 10/0525 |
| 2022/0228288 A1* | 7/2022 | Holman | C30B 29/22 |
| 2022/0267216 A1 | 8/2022 | Holman et al. | |
| 2022/0314325 A1 | 10/2022 | Badwe | |
| 2022/0324022 A1 | 10/2022 | Badwe | |
| 2022/0352549 A1 | 11/2022 | Kim et al. | |
| 2023/0001375 A1* | 1/2023 | Kozlowski | B01J 19/088 |
| 2023/0001376 A1* | 1/2023 | Kozlowski | B01J 19/126 |
| 2023/0032362 A1 | 2/2023 | Holman et al. | |
| 2023/0100863 A1* | 3/2023 | Lianto | H01J 37/32816 |
| | | | 134/1.1 |
| 2023/0143022 A1* | 5/2023 | Mills | G21G 7/00 |
| | | | 423/239.1 |
| 2023/0144075 A1 | 5/2023 | Badwe et al. | |
| 2023/0211407 A1 | 7/2023 | Hadidi | |
| 2023/0219134 A1 | 7/2023 | Houshmand et al. | |
| 2023/0245896 A1* | 8/2023 | Gupta | C23C 16/5096 |
| | | | 438/680 |
| 2023/0247751 A1* | 8/2023 | Kozlowski | H05H 1/30 |
| | | | 118/620 |
| 2023/0298885 A1* | 9/2023 | Borude | H01L 21/02348 |
| 2023/0330747 A1* | 10/2023 | Barnes | B33Y 70/00 |
| 2023/0330748 A1 | 10/2023 | Badwe et al. | |
| 2023/0377848 A1 | 11/2023 | Holman et al. | |
| 2023/0411123 A1 | 12/2023 | Kozlowski et al. | |
| 2024/0017322 A1 | 1/2024 | Badwe et al. | |
| 2024/0057245 A1 | 2/2024 | Kozlowski et al. | |
| 2024/0088369 A1 | 3/2024 | Holman et al. | |

FOREIGN PATENT DOCUMENTS

| | | |
|---|---|---|
| CA | 2947531 A1 | 11/2015 |
| CN | 1188073 A | 7/1998 |
| CN | 1653869 A | 8/2005 |
| CN | 1675785 A | 9/2005 |
| CN | 1967911 A | 5/2007 |
| CN | 101191204 A | 6/2008 |
| CN | 101391307 A | 3/2009 |

(56) References Cited

FOREIGN PATENT DOCUMENTS

| | | | |
|---|---|---|---|
| CN | 101728509 A | 6/2010 |
| CN | 101804962 A | 8/2010 |
| CN | 101716686 B | 2/2011 |
| CN | 102179521 A | 9/2011 |
| CN | 102328961 A | 1/2012 |
| CN | 102394290 A | 3/2012 |
| CN | 102412377 A | 4/2012 |
| CN | 102427130 A | 4/2012 |
| CN | 102664273 A | 9/2012 |
| CN | 102723502 A | 10/2012 |
| CN | 102867940 A | 1/2013 |
| CN | 102983312 A | 3/2013 |
| CN | 103121105 A | 5/2013 |
| CN | 103402921 A | 11/2013 |
| CN | 102554242 B | 12/2013 |
| CN | 103456926 A | 12/2013 |
| CN | 103682372 A | 3/2014 |
| CN | 103682383 A | 3/2014 |
| CN | 103700815 A | 4/2014 |
| CN | 103874538 A | 6/2014 |
| CN | 103956520 A | 7/2014 |
| CN | 104064736 A | 9/2014 |
| CN | 104084592 A | 10/2014 |
| CN | 104209526 A | 12/2014 |
| CN | 104218213 A | 12/2014 |
| CN | 204156003 U | 2/2015 |
| CN | 104485452 A | 4/2015 |
| CN | 104752734 A | 7/2015 |
| CN | 104772473 A | 7/2015 |
| CN | 103515590 B | 9/2015 |
| CN | 105514373 A | 4/2016 |
| CN | 106001597 A | 10/2016 |
| CN | 106044777 A | 10/2016 |
| CN | 106159316 A | 11/2016 |
| CN | 106216703 A | 12/2016 |
| CN | 106450146 A | 2/2017 |
| CN | 106493350 A | 3/2017 |
| CN | 206040854 U | 3/2017 |
| CN | 106684387 A | 5/2017 |
| CN | 106756417 A | 5/2017 |
| CN | 106784692 A | 5/2017 |
| CN | 107093732 A | 8/2017 |
| CN | 107170973 A | 9/2017 |
| CN | 107579241 A | 1/2018 |
| CN | 107931622 A | 4/2018 |
| CN | 108134104 A | 6/2018 |
| CN | 108145170 A | 6/2018 |
| CN | 108217612 A | 6/2018 |
| CN | 108649190 A | 10/2018 |
| CN | 108666563 A | 10/2018 |
| CN | 108672709 A | 10/2018 |
| CN | 108878862 A | 11/2018 |
| CN | 108907210 A | 11/2018 |
| CN | 108933239 A | 12/2018 |
| CN | 108963239 A | 12/2018 |
| CN | 109167070 A | 1/2019 |
| CN | 109301212 A | 2/2019 |
| CN | 109616622 A | 4/2019 |
| CN | 109742320 A | 5/2019 |
| CN | 109808049 A | 5/2019 |
| CN | 109888233 A | 6/2019 |
| CN | 110153434 A | 8/2019 |
| CN | 110218897 A | 9/2019 |
| CN | 110299516 A | 10/2019 |
| CN | 110790263 A | 2/2020 |
| CN | 110993908 A | 4/2020 |
| CN | 111099577 A | 5/2020 |
| CN | 111342163 A | 6/2020 |
| CN | 111370751 A | 7/2020 |
| CN | 111403701 A | 7/2020 |
| CN | 111515391 A | 8/2020 |
| CN | 111970807 A | 11/2020 |
| CN | 112259740 A | 1/2021 |
| CN | 112331947 A | 2/2021 |
| CN | 112397706 A | 2/2021 |
| CN | 112421006 A | 2/2021 |
| CN | 112421048 A | 2/2021 |
| CN | 112447977 A | 3/2021 |
| CN | 112768709 A | 5/2021 |
| CN | 112768710 A | 5/2021 |
| CN | 112768711 A | 5/2021 |
| CN | 112864453 A | 5/2021 |
| CN | 113097487 A | 7/2021 |
| CN | 113104838 A | 7/2021 |
| CN | 113764688 A | 12/2021 |
| CN | 113871581 A | 12/2021 |
| CN | 114388822 A | 4/2022 |
| CN | 114744315 A | 7/2022 |
| CN | 114824297 A | 7/2022 |
| CN | 115394976 A | 11/2022 |
| DE | 10335355 A1 | 11/2004 |
| DE | 102009033251 A1 | 9/2010 |
| DE | 102010006440 A1 | 8/2011 |
| DE | 102011109137 A1 | 2/2013 |
| DE | 102018132896 A1 | 6/2020 |
| EP | 0256233 A2 | 2/1988 |
| EP | 2292557 A1 | 3/2011 |
| EP | 3143838 A1 | 3/2017 |
| EP | 3474978 A1 | 5/2019 |
| FR | 2525122 A1 | 10/1983 |
| FR | 2591412 A1 | 6/1987 |
| GB | 2595745 A | 12/2021 |
| GB | 2620597 A | 1/2024 |
| IN | 202011017775 | 10/2021 |
| JP | 63-243212 A | 10/1988 |
| JP | 10-172564 A | 6/1998 |
| JP | 10-296446 A | 11/1998 |
| JP | 11-064556 A | 3/1999 |
| JP | 2001-064703 A | 3/2001 |
| JP | 2001-504753 A | 4/2001 |
| JP | 2001-348296 A | 12/2001 |
| JP | 2002-249836 A | 9/2002 |
| JP | 2002-332531 A | 11/2002 |
| JP | 2004-034014 A | 2/2004 |
| JP | 2004-505761 A | 2/2004 |
| JP | 2004-193115 A | 7/2004 |
| JP | 2004-232084 A | 8/2004 |
| JP | 2004-311297 A | 11/2004 |
| JP | 2004-340414 A | 12/2004 |
| JP | 2004-362895 A | 12/2004 |
| JP | 2005-015282 A | 1/2005 |
| JP | 2005-072015 A | 3/2005 |
| JP | 2005-076052 A | 3/2005 |
| JP | 2005-135755 A | 5/2005 |
| JP | 2005-187295 A | 7/2005 |
| JP | 2005-222956 A | 8/2005 |
| JP | 2005-272284 A | 10/2005 |
| JP | 2006-040722 A | 2/2006 |
| JP | 2007-113120 A | 5/2007 |
| JP | 2007-138287 A | 6/2007 |
| JP | 2007-149513 A | 6/2007 |
| JP | 2007-238402 A | 9/2007 |
| JP | 2008-230905 A | 10/2008 |
| JP | 2008-243447 A | 10/2008 |
| JP | 2009-187754 A | 8/2009 |
| JP | 2010-024506 A | 2/2010 |
| JP | 2010-097914 A | 4/2010 |
| JP | 2011-108406 A | 6/2011 |
| JP | 2011-222323 A | 11/2011 |
| JP | 2011-258348 A | 12/2011 |
| JP | 2012-046393 A | 3/2012 |
| JP | 2012-151052 A | 8/2012 |
| JP | 2012-234788 A | 11/2012 |
| JP | 2013-062242 A | 4/2013 |
| JP | 2013-063539 A | 4/2013 |
| JP | 2013-069602 A | 4/2013 |
| JP | 2013-076130 A | 4/2013 |
| JP | 2015-048269 A | 3/2015 |
| JP | 2015-122218 A | 7/2015 |
| JP | 2016-029193 A | 3/2016 |
| JP | 2016-047961 A | 4/2016 |
| JP | 6103499 B2 | 3/2017 |
| JP | 2017-524628 A | 8/2017 |
| JP | 2018-141762 A | 9/2018 |

(56) References Cited

FOREIGN PATENT DOCUMENTS

| | | |
|---|---|---|
| JP | 2018-528328 A | 9/2018 |
| JP | 2018-190563 A | 11/2018 |
| JP | 2019-055898 A | 4/2019 |
| JP | 2019-516020 A | 6/2019 |
| JP | 2019-112699 A | 7/2019 |
| JP | 2019-520894 A | 7/2019 |
| JP | 2020-121898 A | 8/2020 |
| JP | 2021-061089 A | 4/2021 |
| JP | 2021-061090 A | 4/2021 |
| JP | 2021-116191 A | 8/2021 |
| JP | 2022-530649 A | 6/2022 |
| KR | 10-0582507 B1 | 5/2006 |
| KR | 10-2007-0076686 A | 7/2007 |
| KR | 10-2009-0070140 A | 7/2009 |
| KR | 10-1133094 B1 | 4/2012 |
| KR | 10-2014-0001813 U | 3/2014 |
| KR | 10-1684219 B1 | 12/2016 |
| KR | 10-2017-0039922 A | 4/2017 |
| KR | 10-2017-0045181 A | 4/2017 |
| KR | 10-2018-0001799 A | 1/2018 |
| KR | 10-2018-0035750 A | 4/2018 |
| KR | 10-1907912 B1 | 10/2018 |
| KR | 10-1907916 B1 | 10/2018 |
| KR | 10-1923466 B1 | 11/2018 |
| KR | 10-2101006 B1 | 4/2020 |
| KR | 10-2124946 B1 | 6/2020 |
| KR | 10-2020-0131751 A | 11/2020 |
| KR | 10-2021-0057253 A | 5/2021 |
| RU | 2744449 C1 | 3/2021 |
| TW | 521539 B | 2/2003 |
| TW | M303584 U | 12/2006 |
| TW | 200737342 A | 10/2007 |
| TW | 200823313 A | 6/2008 |
| TW | I329143 B | 8/2010 |
| TW | 201112481 A | 4/2011 |
| TW | 201225389 A | 6/2012 |
| TW | 201310758 A | 3/2013 |
| TW | 201411922 A | 3/2014 |
| TW | I593484 B | 8/2017 |
| TW | 202002723 A | 1/2020 |
| TW | 202033297 A | 9/2020 |
| WO | 03/77333 A1 | 9/2003 |
| WO | 2004/054017 A1 | 6/2004 |
| WO | 2004/089821 A1 | 10/2004 |
| WO | 2005/039752 A1 | 5/2005 |
| WO | 2006/100837 A1 | 9/2006 |
| WO | 2010/095726 A1 | 8/2010 |
| WO | 2011/082596 A1 | 7/2011 |
| WO | 2011/090779 A2 | 7/2011 |
| WO | 2012/023858 A1 | 2/2012 |
| WO | 2012/114108 A1 | 8/2012 |
| WO | 2012/144424 A1 | 10/2012 |
| WO | 2012/162743 A1 | 12/2012 |
| WO | 2013/017217 A1 | 2/2013 |
| WO | 2014/011239 A2 | 1/2014 |
| WO | 2014/110604 A2 | 7/2014 |
| WO | 2014/153318 A1 | 9/2014 |
| WO | 2015/064633 A1 | 5/2015 |
| WO | 2015/174949 A1 | 11/2015 |
| WO | 2015/187389 A2 | 12/2015 |
| WO | 2016/048862 A1 | 3/2016 |
| WO | 2016/082120 A1 | 6/2016 |
| WO | 2016/091957 A1 | 6/2016 |
| WO | 2017/074081 A1 | 5/2017 |
| WO | 2017/074084 A1 | 5/2017 |
| WO | 2017/080978 A1 | 5/2017 |
| WO | 2017/091543 A1 | 6/2017 |
| WO | 2017/106601 A8 | 7/2017 |
| WO | 2017/118955 A1 | 7/2017 |
| WO | 2017/130946 A1 | 8/2017 |
| WO | 2017/158349 A1 | 9/2017 |
| WO | 2017/177315 A1 | 10/2017 |
| WO | 2017/178841 A1 | 10/2017 |
| WO | 2017/223482 A1 | 12/2017 |
| WO | 2018/133429 A1 | 7/2018 |
| WO | 2018/141082 A1 | 8/2018 |
| WO | 2018/145750 A1 | 8/2018 |
| WO | 2019/045923 A1 | 3/2019 |
| WO | 2019/052670 A1 | 3/2019 |
| WO | 2019/095039 A1 | 5/2019 |
| WO | 2019/124344 A1 | 6/2019 |
| WO | 2019/139773 A1 | 7/2019 |
| WO | 2019/178668 A1 | 9/2019 |
| WO | 2019/243870 A1 | 12/2019 |
| WO | 2019/246242 A1 | 12/2019 |
| WO | 2019/246257 A1 | 12/2019 |
| WO | 2020/009955 A1 | 1/2020 |
| WO | 2020/013667 A1 | 1/2020 |
| WO | 2020/041767 A1 | 2/2020 |
| WO | 2020/041775 A1 | 2/2020 |
| WO | 2020/091854 A1 | 5/2020 |
| WO | 2020/132343 A1 | 6/2020 |
| WO | 2020/223358 A1 | 11/2020 |
| WO | 2020/223374 A1 | 11/2020 |
| WO | 2021/029769 A1 | 2/2021 |
| WO | 2021/046249 A1 | 3/2021 |
| WO | 2021/085670 A1 | 5/2021 |
| WO | 2021/115596 A1 | 6/2021 |
| WO | 2021/118762 A1 | 6/2021 |
| WO | 2021/127132 A1 | 6/2021 |
| WO | 2021/159117 A1 | 8/2021 |
| WO | 2021/191281 A1 | 9/2021 |
| WO | 2021/245410 A1 | 12/2021 |
| WO | 2021/245411 A1 | 12/2021 |
| WO | 2021/263273 A1 | 12/2021 |
| WO | 2022/005999 A1 | 1/2022 |
| WO | 2022/032301 A1 | 2/2022 |
| WO | 2022/043701 A1 | 3/2022 |
| WO | 2022/043702 A1 | 3/2022 |
| WO | 2022/043704 A1 | 3/2022 |
| WO | 2022/043705 A1 | 3/2022 |
| WO | 2022/067303 A1 | 3/2022 |
| WO | 2022/075846 A1 | 4/2022 |
| WO | 2022/107907 A1 | 5/2022 |
| WO | 2022/133585 A1 | 6/2022 |
| WO | 2022/136699 A1 | 6/2022 |
| WO | 2023/022492 A1 | 2/2023 |
| WO | 2024/013488 A1 | 1/2024 |

OTHER PUBLICATIONS

"High-entropy alloy", Wikipedia, webpage last edited Dec. 29, 2022 (accessed Jan. 17, 2023), in 16 pages. URL: https://en.wikipedia.org/wiki/High-entropy_alloy.

6K, "6K Launches World's First Premium Metal Powders For Additive Manufacturing Derived From Sustainable Sources", Cision PR Newswire, Nov. 4, 2019, in 1 page. URL: https://www.prnewswire.com/news-releases/6k-launches-worlds-first-premium-metal-powders-for-additive-manufacturing-derived-from-sustainable-sources-300950791.html.

Ajayi, B. et al., "A rapid and scalable method for making mixed metal oxide alloys for enabling accelerated materials discovery", Journal of Materials Research, Jun. 2016, vol. 31, No. 11, pp. 1596-1607.

Ajayi, B. P. et al., "Atmospheric plasma spray pyrolysis of lithiated nickel-manganese-cobalt oxides for cathodes in lithium-ion batteries", Chemical Engineering Science, vol. 174, Sep. 14, 2017, pp. 302-310.

Ali, M. et al., Spray Flame Synthesis (SFS) of Lithium Lanthanum Zirconate (LLZO) Solid Electrolyte, Materials, vol. 14, No. 13, 2021, pp. 1-13.

Barbis et al., "Titanium powders from the hydride-dehydride process." Titanium Powder Metallurgy. Butterworth-Heinemann, 2015. pp. 101-116.

Bardos, L., et al., "Differences between microwave and RF activation of nitrogen for the PECVD process", J. Phys. D: Appl. Phys., vol. 15, 1982, pp. 79-82.

Bardos, L., et al., "Microwave Plasma Sources and Methods in Processing Technology", IEEE Press, 2022, 10 pages.

(56) References Cited

OTHER PUBLICATIONS

Bobzin, K. et al., "Modelling and Diagnostics of Multiple Cathodes Plasma Torch System for Plasma Spraying", Frontiers of Mechanical Engineering, Sep. 2011, vol. 6, pp. 324-331.

Bobzin, K. et al., "Numerical and Experimental Determination of Plasma Temperature during Air Plasma Spraying with a Multiple Cathodes Torch", Journal of Materials Processing Technology, Oct. 2011, vol. 211, pp. 1620-1628.

Boulos, M. I., "The inductively coupled radio frequency plasma." Journal of High Temperature Material Process, Jan. 1997, vol. 1, pp. 17-39.

Boulos, M., "Induction Plasma Processing of Materials for Powders, Coatings, and Near-Net-Shape Parts", Advanced Materials & Processes, Aug. 2011, pp. 52-53, in 3 pages.

Boulos, M., "Plasma power can make better powders", Metal Powder Report, May 2004, vol. 59(5), pp. 16-21.

Carreon, H. et al., "Study of Aging Effects in a Ti-6AL-4V alloy with Widmanslallen and Equiaxed Microstructures by Nondestructive Means", AIP Conference Proceedings 1581, 2014 (published online Feb. 17, 2015), pp. 739-745.

Chang, S. et al., "One-Step Fast Synthesis of Li4Ti5O12 Particles Using an Atmospheric Pressure Plasma Jet", Journal of the American Ceramic Society, Dec. 26, 2013, vol. 97, No. 3, pp. 708-712.

Chau, J. L. K. et al. "Microwave Plasma Production of Metal Nanopowders," Jun. 12, 2014, Inorganics, vol. 2, pp. 278-290 (Year: 2014).

Chen, G. et al., "Spherical Ti-6Al-4V Powders Produced by Gas Atomization", Key Engineering Materials, vol. 704, Aug. 2016, pp. 287-292. URL: https://www.scientific.net/KEM.704.287.

Chen, Z., et al., "Advanced cathode materials for lithium-ion batteries", MRS Bulletin, vol. 36, No. 7, 2011, pp. 498-505.

Chikumba et al., "High Entropy Alloys: Development and Applications" 7th International Conference on Latest Trends in Engineering & Technology (ICLTET'2015) Nov. 26-27, 2015 Irene, Pretoria (South Africa).

Choi, S. I., et al., "Continuous process of carbon nanotubes synthesis by decomposition of methane using an arc-jet plasma", Thin Solid Films, 2006, vol. 506-507, 2006, pp. 244-249.

Coldwell, D. M. et al., "The reduction of SiO.sub.2 with Carbon in a Plasma", Journal of Electrochemical Society, Jan. 1977, vol. 124, pp. 1686-1689.

Collin, J. E., et al., "Ionization of methane and it's electronic energy levels", Canadian Journal of Chemistry, 2011, vol. 45, No. 16, pp. 1875-1882.

Dearmiti, C., "26. Functional Fillers for Plastics", in Applied Plastics Engineering Handbook—Processing and Materials, ed., Myer Kuiz, Elsevier, 2011, pp. 455-468.

Decker, J., et al., "Sample preparation protocols for realization of reproducible characterization of single-wall carbon nanotubes", Metrologia, 2009, vol. 46, No. 6, pp. 682-692.

Ding, F., et al., "Nucleation and Growth of Single-Walled Carbon Nanotubes: A Molecular Dynamics Study", J. Phys. Chem. B, vol. 108, 2004, pp. 17369-17377.

Ding, F., et al., "The Importance of Strong Carbon-Metal Adhesion for Catalytic Nucleation of Single-Walled Carbon Nanotubes", Nano Letters, 2008, vol. 8, No. 2, pp. 463-468.

Dolbec, R., "Recycling Spherical Powders", Presented at Titanium 2015, Orlando, FL, Oct. 2015, in 20 pages.

Dors, M., et al., "Chemical Kinetics of Methane Pyrolysis in Microwave Plasma at Atmospheric Pressure", Plasma Chem Plasma Process, 2013, vol. 34, No. 2, pp. 313-326.

Eremin, A., et al., "The Role of Methyl Radical in Soot Formation", Combustion Science and Technology, vol. 191, No. 12, 2008, pp. 2226-2242.

Finckle, J. R., et al., "Plasma Pyrolysis of Methane to Hydrogen and Carbon Black", Industrial Engineering and Chemical Research, 2002. Vol. 41, No. 6, 2002, pp. 1425-1435.

Fu, D., et al., "Direct synthesis of Y-junction carbon nanotubes by microwave-assisted pyrolysis of methane", Materials Chemistry and Physics, vol. 118, vol. 2-3, 2009, pp. 501-505.

Fuchs, G.E. et al., "Microstructural evaluation of as-solidified and heat-treated y-TiAl based powders", Materials Science and Engineering, 1992, A152, pp. 277-282.

Gleiman, S. et al., "Melting and spheroidization of hexagonal boron nitride in a microwave-powered, atmospheric pressure nitrogen plasma", Journal of Materials Science, Aug. 2002, vol. 37(16), pp. 3429-3440.

Grace, J. et al., "Connecting particle sphericity and circularity", Particuology, vol. 54, 2021, pp. 1-4, ISSN 1674-2001, https://doi.org/10.1016/j.partic.2020.09.006. (Year: 2020).

Gradl, P. et al., "GRCop-42 Development and Hot-fire Testing Using Additive Manufacturing Powder Bed Fusion for Channel-Cooled Combustion Chambers", 55th AIAA/SAE/ASEE Joint Propulsion Conference 2019, Aug. 2019, pp. 1-26.

Haghighatpanah, S., et al., "Computational studies of catalyst-free single walled carbon nanotube growth", J Chem Phys, vol. 139, No. 5, 10 pages.

Haneklaus, N., et al., "Stop Smoking—Tube-In-Tube Helical System for Flameless Calcination of Minerals", Processes, vol. 5, No. 4, 2017, pp. 1-12.

He et al., "A precipitation-hardened high-entropy alloy with outstanding tensile properties" Acta Materialia 102, Jan. 2016, pp. 187-196.

Houmes et al., "Microwave Synthesis of Ternary Nitride Materials", Journal of Solid State Chemistry, vol. 130, Issue 2, May 1997, pp. 266-271.

Huo, H., et al., "Composite electrolytes of polyethylene oxides/garnets interfacially wetted by ionic liquid for room-temperature solid-state lithium battery", Journal of Power Sources, vol. 372, 2017, pp. 1-7.

International Search Report and Written Opinion, re PCT Application No. PCT/US2023/072411, mailed Nov. 8, 2023.

Irle, S., et al., "Milestones in molecular dynamics simulations of single-walled carbon nanotube formation: A brief critical review", Nano Research, 2009, vol. 2, No. 10, 14 pages.

Ivasishin, et al., "Innovative Process for Manufacturing Hydrogenated Titanium Powder for Solid State Production of R/M Titanium Alloy Components" Titanium 2010, Oct. 3-6, 2010, 27 pages.

Jasek, O., et al., "Microwave plasma-based high temperature dehydrogenation of hydrocarbons and alcohols as a single route to highly efficient gas phase synthesis of freestanding graphene", Nanotechnology, 2021, vol. 32, 11 pages.

Jasinski, M., et al., "Atmospheric pressure microwave plasma source for hydrogen production", International Journal of Hydrogen Energy, vol. 38, Issue 26, 2013, pp. 11473-11483.

Jasinski, M., et al., "Hydrogen production via methane reforming using various microwave plasma sources", Chem. Listy, 2008, vol. 102, pp. s1332-s1337.

Jia, H. et al., "Hierarchical porous silicon structures with extraordinary mechanical strength as high-performance lithium-ion battery anodes", Nature Communications, Mar. 2020, vol. 11, in 9 pages. URL: https://doi.org/10.1038/s41467-020-15217-9.

Kassel, L. S., "The Thermal Decomposition of Methane", Journal of the American Chemical Society, vol. 54, No. 10, 1932, pp. 3949-3961.

Kerscher, F., et al., "Low-carbon hydrogen production via electron beam plasma methane pyrolysis: Techno-economic analysis and carbon footprint assessment", International Journal of Hydrogen Energy, vol. 46, Issue 38, 2021, pp. 19897-19912.

Yang et al., "Preparation of Spherical Titanium Powders from Polygonal Titanium Hydride Powders by Radio Frequency Plasma Treatment" Materials Transactions, vol. 54, No. 12 (2013) pp. 2313-2316.

Zavilopulo, A. N., et al., "Ionization and Dissociative Ionization of Methane Molecules", Technical Physics, vol. 58, No. 9, 2013, pp. 1251-1257.

Zeng, X., et al., "Growth and morphology of carbon nanostructures by microwave-assisted pyrolysis of methane", Physica E., vol. 42, No. 8, 2010, pp. 2103-2108.

Zhang, K., Ph.D., "The Microstructure and Properties of Hipped Powder Ti Alloys", a thesis submitted to The University of Birmingham, College of Engineering and Physical Sciences, Apr. 2009, in 65 pages.

(56) References Cited

OTHER PUBLICATIONS

Zhang et al., Microstructures and properties of high-entropy alloys, Progress in Materials Science, vol. 61, 2013, pp. 1-93.

Zhang, H., et al., "Plasma activation of methane for hydrogen production in a N2 rotating gliding arc warm plasma: A chemical kinetics study", Chemical Engineering Journal, vol. 345, 2018, pp. 67-78.

Zhang, J., et al., "Flexible and ion-conducting membrane electrolytes for solid-state lithium batteries: Dispersion of garnet nanoparticles in insulating polyethylene oxide", Nano Energy, vol. 28, 2016, pp. 447-454.

Zhang, X. et al., "High thickness tungsten coating with low oxygen content prepared by air plasma spray", Cailliao Gongcheng. (2014) (5) pp. 23-28 (Year: 2014).

Zhang, Y. D. et al., "High-energy cathode materials for Li-ion batteries: A review of recent developments", Science China Technological Sciences, Sep. 2015, vol. 58(11), pp. 1809-1828.

Zhang, Y. S. et al., "Core-shell structured titanium-nitrogen alloys with high strength, high thermal stability and good plasticity", Scientific Reports, Jan. 2017, vol. 7, in 8 pages.

Zhong, R., et al., "Continuous preparation and formation mechanism of few-layer graphene by gliding arc plasma", Chemical Engineering Journal, vol. 387, 2020, 10 pages.

Zielinski, A et al., "Modeling and Analysis of a Dual-Channel Plasma Torch in Pulsed Mode Operation For Industrial Space, and Launch Applications", IEEE Transactions on Plasma Science, Jul. 2015, vol. 43(7), pp. 2201-2206.

Kim, H., et al., "Three-Dimensional Porous Silicon Particles for Use in High-Performance Lithium Secondary Batteries", Angewandte Chemie International Edition, vol. 47, No. 2, Dec. 15, 2008, pp. 10151-10154.

Kim, K. S., et al., "Synthesis of single-walled carbon nanotubes by induction thermal plasma", Nano Research, 2009, vol. 2, No. 10, pp. 800-817.

Kim, S. et al., "Thermodynamic Evaluation of Oxygen Behavior in Ti Powder Deoxidized by Ca Reductant", Met. Mater. Int., 2016, vol. 22, pp. 658-662.

Ko, M. et al., "Challenges in Accommodating vol. Change of Si Anodes for Li-Ion Batteries", Chem Electro Chem, Aug. 2015, vol. 2, pp. 1645-1651. URL: https://doi.org/10.1002/celc.201500254.

Kotlyarov, V. I. et al, "Production of Spherical Powders on the Basis of Group IV Metals for Additive Manufacturing", Inorganic Materials: Applied Research, Pleiades Publishing, May 2017, vol. 8, No. 3, pp. 452-458.

Kumal, R. R., et al., "Microwave Plasma Formation of Nanographene and Graphitic Carbon Black", C—Journal of Carbon Research, 2020, vol. 6, No. 4, 10 pages.

Laine, R. M. et al., "Making nanosized oxide powders from precursors by flame spray pyrolysis", Key Engineering Materials, Jan. 1999, vol. 159-160, pp. 17-24.

Lee, D. H., et al., "Comparative Study of Methane Activation Process by Different Plasma Sources", Plasma Chem. Plasma Process., vol. 33, No. 4, 2013, pp. 647-661.

Lee, D. H., et al., "Mapping Plasma Chemistry in Hydrocarbon Fuel Processing Processes", Plasma Chem. Plasma Process., vol. 33, No. 1, 2013, pp. 249-269.

Li, L. et al., "Spheroidization of silica powders by radio frequency inductively coupled plasma with Ar—H2 and Ar—N2 as the sheath gases at atmospheric pressure", International Journal of Minerals, Metallurgy, and Materials, Sep. 2017, vol. 24(9), pp. 1067-1074.

Li, X. et al., "Mesoporous silicon sponge as an anti-pulverization structure for high-performance lithium-ion battery anodes", Nature Communications, Jul. 2014, vol. 5, Article No. 4105, in 7 pages. URL: httDs://doi.orq/10.1038/ncomms5105.

Li, Z. et al., "Strong and Ductile Non-Equicaloric High-Entropy Alloys: Design, Processing, Microstructure, and Mechanical Properties", The Journal of the Minerals, Metals & Materials Society, Aug. 2017, vol. 69(1), pp. 2099-2106. URL: https://doi.org/10.1007/s11837-017-2540-2.

Lin et al., "A low temperature molten salt process for aluminothermic reduction of silicon oxides to crystalline Si for Li-ion batteries", Energy Environ. Sci., 2015, 8, 3187 (Year: 2015).

Lin, M., "Gas Quenching with Air Products' Rapid Gas Quenching Gas Mixture", Air Products, Dec. 31, 2007, in 4 pages. URL: hllps://www.airproducts.co.uk/-/media/airproducts/liles/en/330/330-07-085-us-gas-quenching-wilh-air-products-rapid-Jas-quenching-gas-mixture.pdf.

Liu, Y., et al., "Advances of microwave plasma-enhanced chemical vapor deposition in fabrication of carbon nanotubes: a review", J Mater Sci., vol. 55, 2021, pp. 12559-12583.

Liu, Z., et al., "Synthesis and characterization of LiNi1-x-yCoxMnyO2 as the cathode materials of secondary lithium batteries", Journal of Power Sources, vol. 81-82, Sep. 1999, pp. 416-419.

Majewksi, T., "Investigation of W—Re—Ni heavy alloys produced from plasma spheroidized powders", Solid State Phenomena, Mar. 2013, vol. 199, pp. 448-453.

Miller et al., "The reduction of silica with carbon and silicon carbide", Journal of the American Ceramic Society, 1978, 62 (Year: 1978).

Moisan, M. et al., "Waveguide-Based Single and Multiple Nozzle Plasma Torches: the Tiago Concept", Plasma Sources Science and Technology, Jun. 2001, vol. 10, pp. 387-394.

Moldover, M. R. et al., "Measurement of the Universal Gas Constant R Using a Spherical Acoustic Resonator", Physical Review Letters, Jan. 1988, vol. 60(4), pp. 249-252.

Muoio, C. et al., "Phase Homogeneity in Y2O3—MgO Nanocomposites Synthesized by Thermal Decomposition of Nitrate Precursors with Ammonium Acetate Additions" J. Am. Ceram. Soc., 94[12] 4207-4217, 2011.

Murugan et al. "Nanostructured a/ß-tungsten by reduction of WO3 under microwave plasma", Int. Journal of Refractory Metals and Hard Materials 29 (2011) 128-133. (Year: 2011).

Nichols, F. A., "On the spheroidization of rod-shaped particles of finite length", Journal of Materials Science, Jun. 1976, vol. 11, pp. 1077-1082.

Nyutu, E. et al., "Ultrasonic Nozzle Spray in Situ Mixing and Microwave-Assisted Preparation of Nanocrystalline Spinel Metal Oxides: Nickel Ferrite and Zinc Aluminate", Journal of Physical Chemistry C, Feb. 1, 2008, vol. 112, No. 5, pp. 1407-1414.

Ohta, R. et al., "Effect of PS-PVD production throughput on Si nanoparticles for negative electrode of lithium ion batteries", Journal of Physics D: Applied Physics, Feb. 2018, vol. 51(1), in 7 pages.

Olsvik, O., et al., "Thermal Coupling of Methane—A Comparison Between Kinetic Model Data and Experimental Data", Thermochimica Acta., vol. 232, No. 1, 1994, pp. 155-169.

Or, T. et al., "Recycling of mixed cathode lithium-ion batteries for electric vehicles: Current status and future outlook", Carbon Energy, Jan. 2020, vol. 2, pp. 6-43. URL: https://doi.org/10.1002/cey2.29.

Park et al. "Preparation of spherical WTaMoNbV refractory high entropy alloy powder by inductively-coupled thermal plasma", Materials Letters 255 (2019) 126513 (Year: 2019).

Popescu et al.. "New TiZrNbTaFe high entropy alloy used for medical applications" IOP Conference Series: Materials Science and Engineering 400. Mod Tech 2018 (2018), 9 pages.

Pulsation Reactors—Thermal Processing for Extraordinary Material Properties, retrieved from https://www.ibu-tec.com/facilities/pulsation-reactors/, retrieved on Mar. 18, 2023, pp. 5.

Reig, L. et al., "Microstructure and Mechanical Behavior of Porous Ti—6Al—4V Processed by Spherical Powder Sintering", Materials, Oct. 23, 2013, vol. 6, pp. 4868-4878.

Sabat, K.C., "Hydrogen Plasma—Thermodynamics", Journal of Physics: Conference Series, 2019, International Conference on Applied Physics, Powder and Material Science, in 6 pages.

Sastry, S.M.L. et al., "Rapid Solidification Processing of Titanium Alloys", Journal of Metals (JOM), Sep. 1983, vol. 35, pp. 21-28.

Savage, S. J. et al., "Production of rapidly solidified metals and alloys", Journal of Metals (JOM), Apr. 1984, vol. 36, pp. 20-33.

Schmidt-Ott, K., "Plasma-Reduction: Its Potential for Use in the Conservation of Metals", Proceedings of Metal 2004, Oct. 2004, pp. 235-246.

(56) References Cited

OTHER PUBLICATIONS

Seehra, M. S., et al., "Correlation between X-ray diffraction and Raman spectra of 16 commercial graphene-based materials and their resulting classification", Carbon N Y., 2017, vol. 111, pp. 380-384.

Sheng, Y. et al., "Preparation of Micro-spherical Titanium Powder by RF Plasma", Rare Metal Materials and Engineering, Jun. 2013, vol. 42, No. 6, pp. 1291-1294.

Sheng, Y. et al., "Preparation of Spherical Tungsten Powder by RF Induction Plasma", Rare Metal Materials and Engineering, Nov. 2011, vol. 40, No. 11, pp. 2033-2037.

SK makes world's 1st NCM battery with 90% nickel, The Investor, available online <https://www.theinvestor.co.kr/view.php?ud=20200810000820>, dated Aug. 10, 2020, 2 pages.

Suryanarayana, C. et al., "Rapid solidification processing of titanium alloys", International Materials Reviews, 1991, vol. 36, pp. 85-123.

Suryanarayana, C., "Recent Developments in Mechanical Alloying", Reviews on Advanced Materials Science, Aug. 2008, vol. 18(3), pp. 203-211.

Tang, H. P. et al., "Effect of Powder Reuse Times on Additive Manufacturing of Ti—6Al—4V by Selective Electron Beam Melting", JOM, Mar. 2015, vol. 67, pp. 555-563.

Taylor, G., et al.; "Reduction of Metal Oxides by Hydrogen", 1930, vol. 52 (Year: 1930).

Thierry, "Hydrogen (H2) Plasma", Thierry Corp., retrieved from internet on Feb. 15, 2024, in 2 pages. URL: https://www.thierry-corp.com/plasma-knowledgebase/hydrogen-h2-plasma.

Van Laar, J. H. et al., "Spheroidization of Iron Powder in a Microwave Plasma Reactor", Journal of the Southern African Institute of Mining and Metallurgy, Oct. 2016, vol. 116, No. 10, pp. 941-946.

Veith, M. et al., "Low temperature synthesis of nanocrystalline Y3Al5012 (YAG) and Ce-doped Y3Al5012 via different sol-gel methods", J. Maler Chem, 1999, pp. 3069-3079.

Walter et al., "Microstructural and mechanical characterization of sol gel-derived Si—O—C glasses" Journal of the European Ceramic Society, vol. 22, Issue 13, Dec. 2002, pp. 2389-2400.

Wang, H., et al., "A detailed kinetic modeling study of aromatics formation in laminar premixed acetylene and ethylene flames" Combustion and Flame, vol. 110, No. 1-2, 1997, pp. 173-221.

Wang, J. et al., "Preparation of Spherical Tungsten and Titanium Powders by RF Induction Plasma Processing", Rare Metals, Jun. 2015 (published online May 31, 2014), vol. 34, No. 6, pp. 431-435.

Wang, Y. et al., "Developments in Nanostructured Cathode Materials for High-Performance Lithium-Ion Batteries", Advanced Materials, Jun. 2008, pp. 2251-2269.

\* cited by examiner

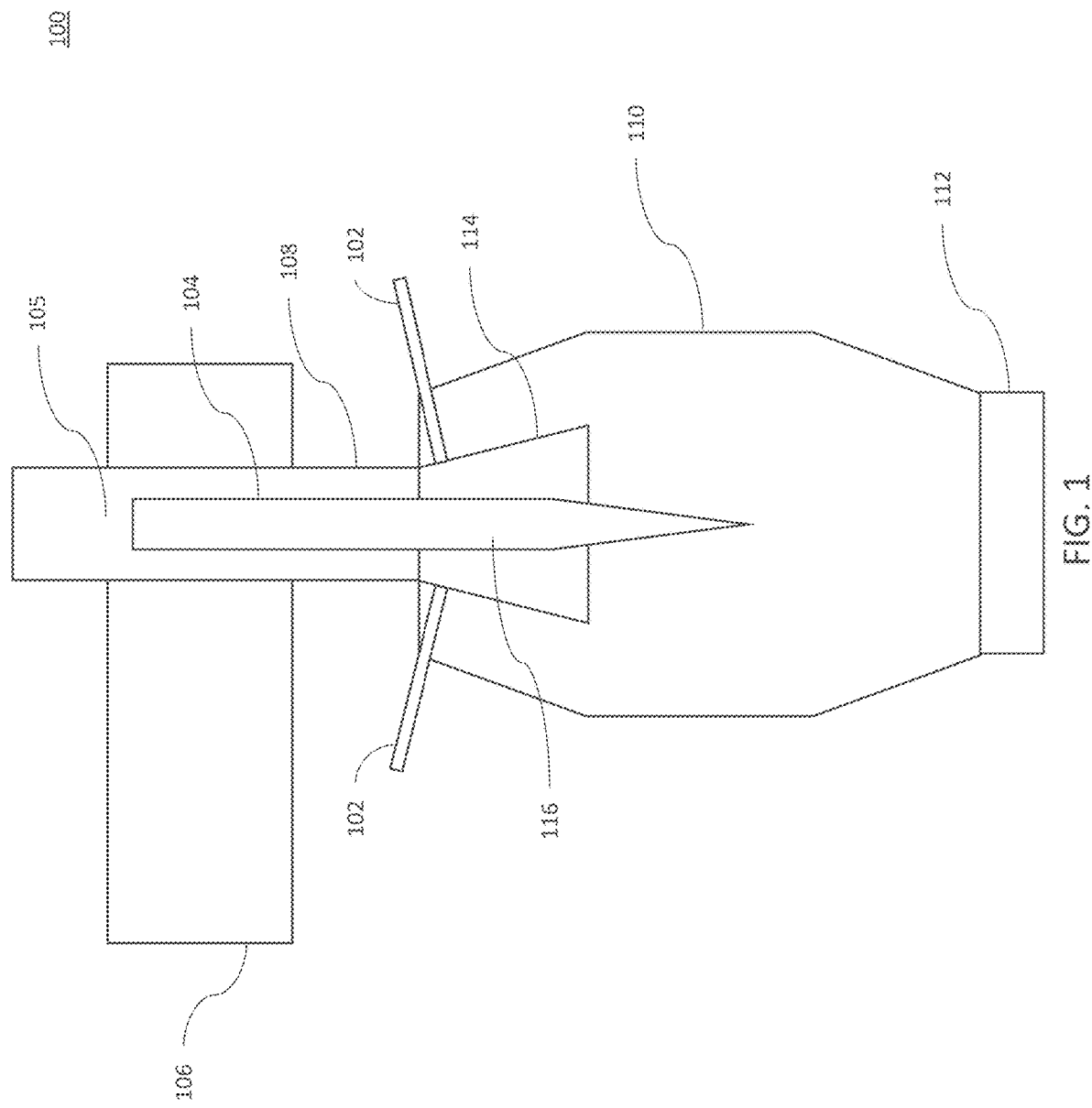

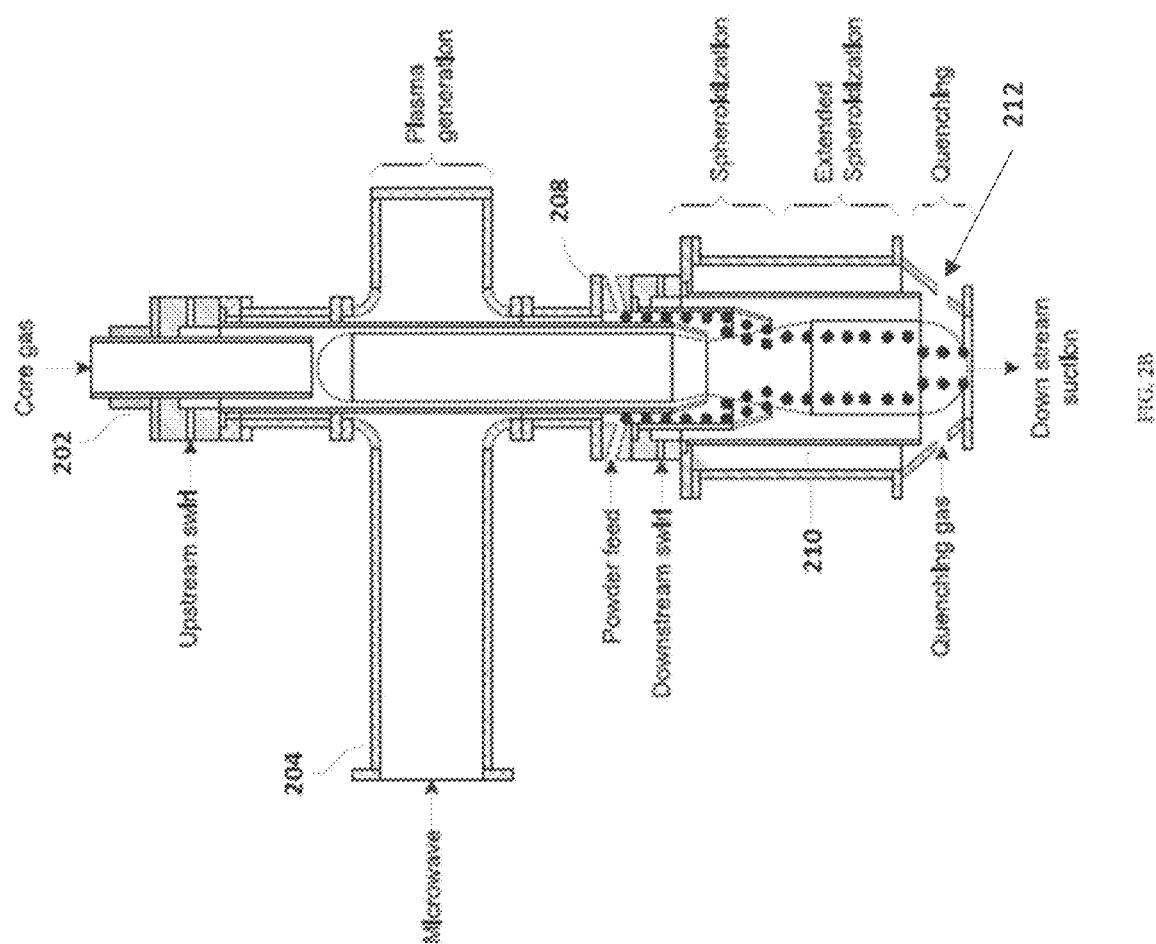

PLASMA APPARATUS AND METHODS FOR PROCESSING FEED MATERIAL UTILIZING A POWDER INGRESS PREVENTOR (PIP)

INCORPORATION BY REFERENCE TO ANY PRIORITY APPLICATIONS

This application claims the priority benefit under 35 U.S.C. § 119(e) of U.S. Provisional Application No. 63/373,528, filed Aug. 25, 2022, the entire disclosure of which is incorporated herein by reference in its entirety. Any and all applications for which a foreign or domestic priority claim is identified in the Application Data Sheet as filed with the present application are hereby incorporated by reference under 37 CFR 1.57.

BACKGROUND

Field

The present invention relates to apparatuses and methods for plasma material processing and, more particularly, to apparatuses and methods for microwave plasma material processing.

Description

Plasma torches generate and provide hot temperature directed flows of plasma for a variety of purposes. The two main types of plasma torches are induction plasma torches and microwave plasma torches. Generally, inductive plasmas suffer from plasma non-uniformity. This non-uniformity leads to limitations on the ability of inductive plasmas to process certain materials. Furthermore, significant differences exist between the microwave plasma apparatuses and other plasma generation torches, such as induction plasma. For example, microwave plasma is hotter on the interior of the plasma plume, while induction is hotter on the outside of the plumes. In particular, the outer region of an induction plasma can reach about 10,000 K while the inside processing region may only reach about 1,000 K. This large temperature difference leads to material processing and feeding problems. Furthermore, induction plasma apparatuses are unable to process feedstocks at low enough temperatures to avoid melting of certain feed materials without extinguishing the plasma.

A conventional microwave plasma apparatus for processing a material includes a plasma chamber, an applicator, a microwave radiation source, and a waveguide guiding microwave radiation from the microwave radiation source to the plasma chamber. A process gas flows through the plasma chamber and the microwave radiation couples to the process gas to produce a plasma jet. A process material is introduced to the plasma chamber, becomes entrained in the plasma jet, and is thereby transformed to a stream of product material droplets or particles.

In conventional microwave plasma apparatuses, normal pressure fluctuations in the plasma chamber can cause the process material to travel backwards into the applicator causing microwave arcing and plasma stability issues. Thus, novel plasma apparatuses and methods for processing materials are needed.

SUMMARY

For purposes of this summary, certain aspects, advantages, and novel features of the invention are described herein. It is to be understood that not all such advantages necessarily may be achieved in accordance with any particular embodiment of the invention. Thus, for example, those skilled in the art will recognize that the invention may be embodied or conducted in a manner that achieves one advantage or group of advantages as taught herein without necessarily achieving other advantages as may be taught or suggested herein.

Some embodiments herein are directed to a microwave plasma apparatus for processing a material, comprising: a core plasma tube; a liner located within and concentric with the core plasma tube; a plasma applicator; and a ring structure located between the core plasma tube and the liner, the ring structure concentric with the core plasma tube and the liner, and the ring structure comprising: a bearing surface, the bearing surface contacting a bottom surface of the plasma applicator; and an opening, the opening surrounding the liner and having a diameter greater than an outer diameter of the liner.

In some embodiments, the ring structure is formed of glass or quartz. In some embodiments, the ring structure comprises a single piece of material. In some embodiments, the ring structure comprises an assembly comprising two or more pieces. In some embodiments, the assembly comprises a first piece comprising a flange and a second piece comprising a tube.

In some embodiments, the ring structure comprises a washer. In some embodiments, the washer comprises a plurality of holes. In some embodiments, the plurality of holes form one or more concentric circles on a surface of the washer. In some embodiments, the ring structure comprises a stack of washers. In some embodiments, the ring structure comprises a stack of two washers, three washers, or four washers.

In some embodiments, the opening comprises one or more indentations or serrations.

In some embodiments, the ring structure comprises an inverted cone. In some embodiments, the inverted cone comprises a rim, the rim comprising one or more holes formed through the rim. In some embodiments, the inverted cone comprises a serrated bottom opening.

Some embodiments herein are directed to a ring structure for preventing powder ingress within a microwave plasma apparatus, the ring structure comprising: a bearing surface, the bearing surface contacting a lower surface of a plasma applicator of the microwave plasma apparatus; and an opening, the opening the opening surrounding a liner of the microwave plasma apparatus and having a diameter greater than an outer diameter of the liner.

In some embodiments, the ring structure is formed of glass or quartz. In some embodiments, the ring structure comprises a single piece of material. In some embodiments, the ring structure comprises an assembly comprising two or more pieces. In some embodiments, the assembly comprises a first piece comprising a flange and a second piece comprising a tube.

In some embodiments, the ring structure comprises a washer. In some embodiments, the washer comprises a plurality of holes. In some embodiments, the plurality of holes form one or more concentric circles on a surface of the washer. In some embodiments, the ring structure comprises a stack of washers. In some embodiments, the ring structure comprises a stack of two washers, three washers, or four washers.

In some embodiments, the opening comprises one or more indentations or serrations.

In some embodiments, the ring structure comprises an inverted cone. In some embodiments, the inverted cone comprises a rim, the rim comprising one or more holes formed through the rim. In some embodiments, the inverted cone comprises a serrated bottom opening.

BRIEF DESCRIPTION OF THE DRAWINGS

The drawings are provided to illustrate example embodiments and are not intended to limit the scope of the disclosure. A better understanding of the systems and methods described herein will be appreciated upon reference to the following description in conjunction with the accompanying drawings, wherein:

FIG. 1 illustrates an example microwave plasma torch 100 that can be used in the processing of feed material materials.

FIGS. 2A-B illustrates an exemplary microwave plasma torch that includes a side feeding hopper, thus allowing for downstream feeding.

DETAILED DESCRIPTION

Figure 2A:
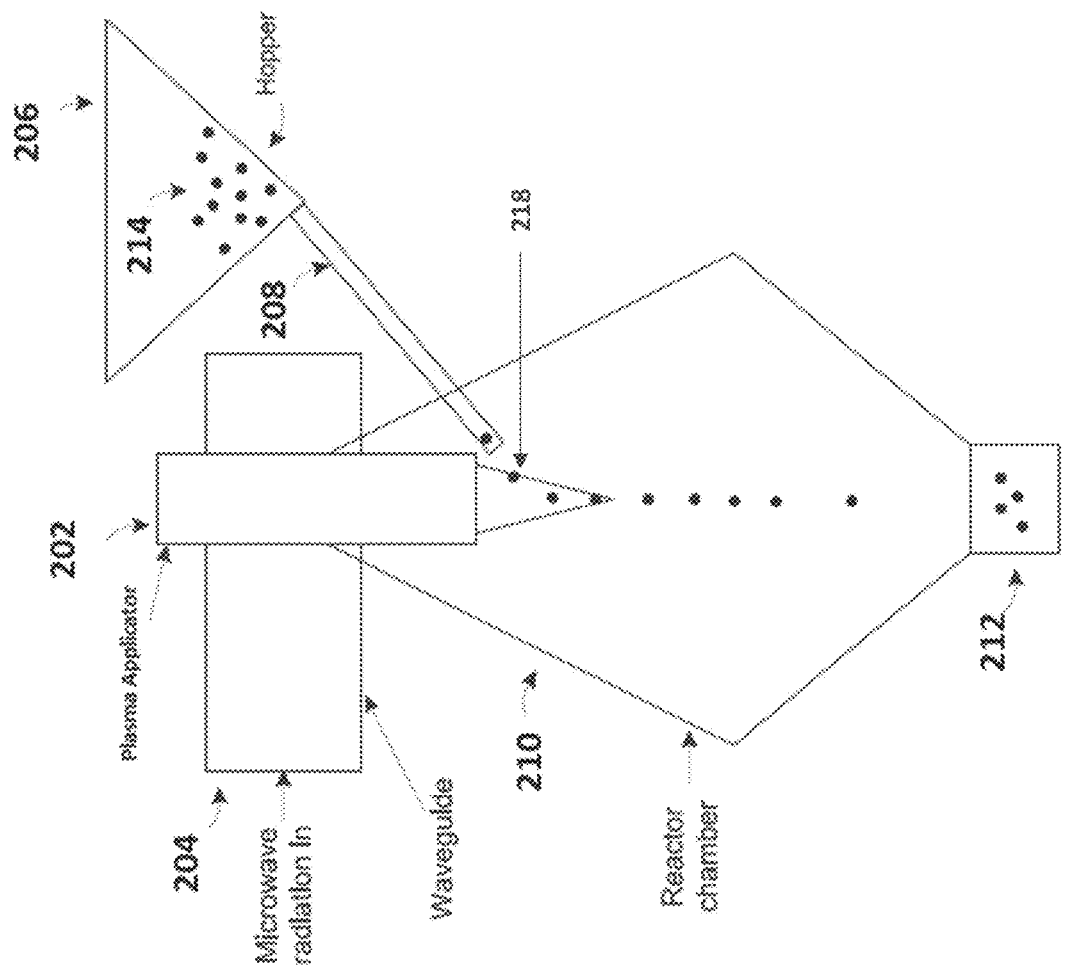

Although certain preferred embodiments and examples are disclosed below, inventive subject matter extends beyond the specifically disclosed embodiments to other alternative embodiments and/or uses and to modifications and equivalents thereof. Thus, the scope of the claims appended hereto or as presented in the future is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components. For purposes of comparing various embodiments, certain aspects and advantages of these embodiments are described. Not necessarily all such aspects or advantages are achieved by any particular embodiment. Thus, for example, various embodiments may be conducted in a manner that achieves or optimizes one advantage or group of advantages as taught herein without necessarily achieving other aspects or advantages as may also be taught or suggested herein.

Certain exemplary embodiments will now be described to provide an overall understanding of the principles of the structure, function, manufacture, and use of the devices and methods disclosed herein. One or more examples of these embodiments are illustrated in the accompanying drawings. Those skilled in the art will understand that the devices and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present technology.

Some embodiments herein are directed to microwave plasma apparatus and methods for processing materials using a microwave plasma apparatus comprising a powder ingress preventor (PIP). In some embodiments, the PIP creates a barrier between the reaction/plasma chamber and the applicator, blocking or collecting powder before it can reach the applicator. In conventional microwave plasma apparatuses, normal pressure fluctuations in the plasma chamber can cause the process material to travel backwards into the applicator causing microwave arcing and plasma stability issues. In some embodiments, the PIP may comprise a barrier between the reaction chamber and the applicator, preventing process material from reaching the applicator. In some embodiments, the PIP completely or at least partially prevents processing material that has reached the reaction chamber from entering the applicator. In some embodiments, the PIP not only deters powder from reaching the applicator, but also collects powder along its entire inner surface. In some embodiments, the PIP may comprise one or more of a filter, shield, collector, tube, washer, cover, and/or other protection device or widget. In some embodiments, the PIP may comprise a quartz sleeve piece laying in the applicator around the liner.

In a conventional apparatus, the applicator, a pressure window, or liner may be dirtied or damaged by material build-up returning from the reaction chamber. Waveguide pressure windows are a type of seal used to prevent contaminants (e.g., moisture, dirt, processing material and dust) from entering the waveguide that transmits microwaves from the microwave generator to the applicator. The pressure window may also isolate pressurized sections of the apparatus from non-pressurized sections of the apparatus. For example, the pressure window can be used to seal waveguides when pressurization or gas filling is required. Waveguide pressure windows enable the signal to pass through but block atmospheric gases or contaminants from getting through. If the pressure window is dirtied or damaged, microwave power transmission may be compromised and pressure imbalance in the apparatus may occur. The liner may comprise an interior surface material or coating in the reaction chamber or core plasma tube that protects the interior wall of the apparatus from heat and processing materials. Damage to the liner may compromise the structural integrity of the microwave plasma apparatus.

To prevent dirtying or damaging the applicator, the pressure window, and/or the liner, the microwave plasma apparatus may be manually cleaned after every use. However, in some embodiments, the utilization of a PIP within a microwave plasma apparatus may prevent material build-up on the interior of or on an exterior surface of the plasma applicator, on a pressure window, or on a liner of the microwave plasma apparatus. Thus, in some embodiments, cleaning of the microwave plasma apparatus may be avoided after each run, increasing uptime of the apparatus, such that throughput is increased.

In a conventional apparatus, the buildup of processing materials may be characterized as either "wet" or "dry." The buildup may be wet when a waveguide gas is not utilized. When waveguide gas is used, such as waveguide gas at a flow rate of about 3 scfm, there may be a dry buildup of processing materials. Waveguide gas is purging gas (typically Ar or N2) that enters the system from the pressure-window assembly and flows directly into the applicator. The gas is injected from the top of the pressure-window assembly, vertically, and/or tangent to the pressure-window. The gas exits the applicator through the lower neck and into the reactor, around the outer diameter of the torch liner. There are two main reasons for using waveguide gas, including keeping buildup off of the pressure window and out of the applicator, and providing a small amount of cooling to the torch liner. In some embodiments, the use of a PIP may prevent wet buildup or dry buildup in a microwave plasma apparatus.

In some embodiments, various design considerations must be accounted for in designing and utilizing a PIP for use in a microwave plasma apparatus. For example, pressure fluctuations from a bag house of the apparatus, extreme heat from the plasma, and microwave interference may all inhibit proper functioning of the PIP. In some embodiments, the PIP utilized according to some embodiments herein may be designed and utilized to withstand pressure fluctuations, extreme heat, and microwave interference. In some embodiments, the PIP is designed with an elongated shape (e.g., instead of being a simple washer). In some embodiments, this design adds weight to the PIP to make it heavier, such that the PIP does not move and/or break during large positive pressure fluctuations. In some embodiments, even if the PIP does move, a long bearing surface may be provided so the PIP does not settle unevenly in the apparatus. In some embodiments, the PIP is made from a single piece of quartz glass. Due to the material properties of quartz glass, the PIP is transparent to microwave radiation (does not absorb or have any significant effect on field characteristics) and can withstand elevated temperature environments.

In conventional microwave plasma apparatuses, powder ingress can introduce various problems in plasma applications. For example, powder ingress can cause issues connected to the pressure window and cause other plasma torch instabilities. In some embodiments, utilizing a PIP may maximize reduction of incidence to a microwave plasma and plasma applicator by powder ingress.

In some embodiments, the PIP may comprise a tube structure and a bearing structure. In some embodiments, a bearing surface, or area of contact between the bearing structure and an interior surface of the microwave plasma torch may be maximized. In some embodiments, maximizing the bearing surface may prevent or mitigate the risk of displacement or disturbance of the PIP due to a pressure spike in the microwave plasma apparatus. In some embodiments, the bag house of the microwave plasma apparatus may occasionally deliver a pressure spike to the system. If a PIP in the form of, for example, a quartz washer was placed around the liner in the plasma applicator, it would have an area exposed to this pressure wave. If the PIP is displaced by the pressure wave, the PIP could fall non-concentrically and cause the liner to be damaged or crack. Thus, in some embodiments, the PIP must be designed in such a way to avoid displacement by pressure spikes or other environmental forces in the system. In some embodiments, the pressure around the plasma application may be about 650 Torr but may rise to at least 700 Torr for about 0.1 s during a pressure spike. In some embodiments, the bearing surface, or the incident area may comprise a solid annulus between the interior diameter of the lower neck/applicator of the core plasma tube of the microwave plasma apparatus, and the outer diameter of the liner covering the core plasma tube.

In some embodiments, the interior diameter of the lower neck/applicator of the core plasma tube may be about 101.6 mm. In some embodiments, the interior diameter of the lower neck/applicator of the core plasma tube may be about mm, about 30 mm, about 55 mm, about 80 mm, about 105 mm, about 130 mm, about 155 mm, about 180 mm, about 205 mm, about 230 mm, about 255 mm, about 280 mm, about 305 mm, about 330 mm, about 355 mm, about 380 mm, about 405 mm, about 430 mm, about 455 mm, about 480 mm, about 500 mm, or any value between the aforementioned values.

In some embodiments, the outer diameter of the liner covering the core plasma tube may be about 77 mm. In some embodiments, the outer diameter of the liner covering the core plasma tube may be about 5 mm, about 30 mm, about 55 mm, about 80 mm, about 105 mm, about 130 mm, about 155 mm, about 180 mm, about 205 mm, about 230 mm, about 255 mm, about 280 mm, about 305 mm, about 330 mm, about 355 mm, about 380 mm, about 405 mm, about 430 mm, about 455 mm, about 480 mm, about 500 mm, or any value between the aforementioned values.

In some embodiments, the area of the exposed annulus may be about 3116.1 mm. In some embodiments, the area of the exposed annulus may comprise the area subjected to the pressure wave/spike/impulse. In some embodiments, the area of the exposed annulus may be about 1000 mm, about 1100 mm, about 1200 mm, about 1300 mm, about 1400 mm, about 1500 mm, about 1600 mm, about 1700 mm, about 1800 mm, about 1900 mm, about 2000 mm, about 2100 mm, about 2200 mm, about 2300 mm, about 2400 mm, about 2500 mm, about 2600 mm, about 2700 mm, about 2800 mm, about 2900 mm, about 3000 mm, about 3100 mm, about 3200 mm, about 3300 mm, about 3400 mm, about 3500 mm, about 3600 mm, about 3700 mm, about 3800 mm, about 3900 mm, about 4000 mm, about 4100 mm, about 4200 mm, about 4300 mm, about 4400 mm, about 4500 mm, about 4600 mm, about 4700 mm, about 4800 mm, about 4900 mm, about 5000 mm, or any value between the aforementioned values.

In some embodiments, the resultant force of a pressure spike may be about 4.8 lbs. In some embodiments, the resultant force of a pressure spike may be about 0.5 lbs., about 1 lbs., about 1.5 lbs., about 2 lbs., about 2.5 lbs., about 3 lbs., about 3.5 lbs., about 4 lbs., about 4.5 lbs., about 5 lbs., about 5.5 lbs., about 6 lbs., about 6.5 lbs., about 7 lbs., about 7.5 lbs., about 8 lbs., about 8.5 lbs., about 9 lbs., about 9.5 lbs., about 10 lbs., about 10.5 lbs., about 11 lbs., about 11.5 lbs., about 12 lbs., about 12.5 lbs., about 13 lbs., about 13.5 lbs., about 14 lbs., about 14.5 lbs., about 15 lbs., about 15.5 lbs., about 16 lbs., about 16.5 lbs., about 17 lbs., about 17.5 lbs., about 18 lbs., about 18.5 lbs., about 19 lbs., about 19.5 lbs., about 20 lbs., about 20.5 lbs., about 21 lbs., about 21.5 lbs., about 22 lbs., about 22.5 lbs., about 23 lbs., about 23.5 lbs., about 24 lbs., about 24.5 lbs., about 25 lbs., or any value between the aforementioned values.

In some embodiments, the time length of a pressure spike may be about 0.1 s. In some embodiments, the time length of a pressure spike may be about 0.01 s, about 0.02 s, about 0.03 s, about 0.04 s, about 0.05 s, about 0.06 s, about 0.07 s, about 0.08 s, about 0.09 s, about 0.1 s, about 0.11 s, about 0.12 s, about 0.13 s, about 0.14 s, about 0.15 s, about 0.16 s, about 0.17 s, about 0.18 s, about 0.19 s, about 0.2 s, about 0.21 s, about 0.22 s, about 0.23 s, about 0.24 s, about 0.25 s, or any value between the aforementioned values.

FIG. 1 illustrates an example microwave plasma torch 100 that can be used in the production of materials. In some embodiments, a feedstock can be introduced, via one or more feedstock inlets 102, into a microwave plasma 104. In some embodiments, an entrainment gas flow and/or a sheath flow may be injected into the microwave plasma applicator 105 to create flow conditions within the plasma applicator prior to ignition of the plasma 104 via microwave radiation source 106. In some embodiments, the entrainment flow and sheath flow are both axis-symmetric and laminar, while in other embodiments the gas flows are swirling. In some embodiments, the feedstock may be introduced into the microwave plasma torch 100, where the feedstock may be entrained by a gas flow that directs the materials toward the plasma 104.

In some embodiments, within the microwave plasma 104, the feedstock may undergo a physical and/or chemical transformation. Inlets 102 can be used to introduce process gases to entrain and accelerate the feedstock towards plasma 104. In some embodiments, a second swirling gas flow can be created to provide sheathing for the inside wall of a plasma applicator 104 and a reaction chamber 110 to protect those structures from melting due to heat radiation from plasma 104.

Various parameters of microwave plasma 104, as created by the plasma applicator 105, may be adjusted manually or automatically in order to achieve a desired material. These parameters may include, for example, power, plasma gas flow rates, type of plasma gas, presence of an extension tube, extension tube material, level of insulation of the reactor chamber or the extension tube, level of coating of the extension tube, geometry of the extension tube (e.g. tapered/stepped), feed material size, feed material insertion rate, feed material inlet location, feed material inlet orientation, number of feed material inlets, plasma temperature, residence time and cooling rates. The resulting material may exit the plasma into sealed chamber 112 where the material is quenched then collected.

In some embodiments, the feedstock is injected after the microwave plasma applicator for processing in the "plume" or "exhaust" of the microwave plasma torch. Thus, the plasma of the microwave plasma torch is engaged at the exit end of the plasma torch core tube 108, or further downstream. In some embodiments, adjustable downstream feeding allows engaging the feedstock with the plasma plume downstream at a temperature suitable for optimal melting of feedstock through precise targeting of temperature level and residence time. Adjusting the inlet location and plasma characteristics may allow for further customization of material characteristics. Furthermore, in some embodiments, by adjusting power, gas flow rates, pressure, and equipment configuration (e.g., introducing an extension tube), the length of the plasma plume may be adjusted.

In some embodiments, feeding configurations may include one or more individual feeding nozzles surrounding the plasma plume. The feedstock may enter the plasma from any direction and can be fed in 360° around the plasma depending on the placement and orientation of the inlets 102. Furthermore, the feedstock may enter the plasma at a specific position along the length of the plasma 104 by adjusting placement of the inlets 102, where a specific temperature has been measured and a residence time estimated for providing the desirable characteristics of the resulting material.

In some embodiments, the angle of the inlets 102 relative to the plasma 104 may be adjusted, such that the feedstock can be injected at any angle relative to the plasma 104. In some embodiments, implementation of the downstream injection method may use a downstream swirl or quenching. A downstream swirl refers to an additional swirl component that can be introduced downstream from the plasma applicator to keep the powder from the walls of the applicator 105, the reactor chamber 110, and/or an extension tube 114.

FIGS. 2A-B illustrates an exemplary microwave plasma torch that includes a side feeding hopper, thus allowing for downstream feeding. Thus, in this implementation the feedstock is injected after the microwave plasma torch applicator for processing in the "plume" or "exhaust" of the microwave plasma torch. Thus, the plasma of the microwave plasma torch is engaged at the exit end of the plasma torch to allow downstream feeding of the feedstock, as opposed to the top-feeding (or upstream feeding). This downstream feeding can advantageously extend the lifetime of the torch as the hot zone is preserved indefinitely from any material deposits on the walls of the hot zone liner. Furthermore, it allows engaging the plasma plume downstream at temperature suitable for optimal melting of powders through precise targeting of temperature level and residence time. For example, there is the ability to dial the length of the plume using microwave powder, gas flows, and pressure in the quenching vessel that contains the plasma plume.

Generally, the downstream feeding can utilize two main hardware configurations to establish a stable plasma plume which are: annular torch, such as described in U.S. Pat. Pub. No. 2018/0297122, the entirety of which is hereby incorporated by reference, or swirl torches described in U.S. Pat. No. 8,748,785 B2 and U.S. Pat. No. 9,932,673 B2, the entireties of which are hereby incorporated by reference. A feed system close-coupled with the plasma plume at the exit of the plasma torch is used to feed powder axisymmetrically to preserve process homogeneity.

Other feeding configurations may include one or several individual feeding nozzles surrounding the plasma plume. The feedstock powder can enter the plasma at a point from any direction and can be fed in from any direction, 360° around the plasma, into the point within the plasma. The feedstock powder can enter the plasma at a specific position along the length of the plasma plume where a specific temperature has been measured and a residence time estimated for sufficient melting of the particles. The melted particles exit the plasma into a sealed chamber where they are quenched then collected.

The feed materials 214 can be introduced into a microwave plasma applicator 202. Hopper 206 can be used to store the feed material 214 before feeding the feed material 214 into the microwave plasma applicator 202, plume and/or exhaust 218. The feed material 214 can be injected at any angle to the longitudinal direction of the plasma applicator 302. 5, 10, 15, 20, 25, 30, 35, 40, 45, 50, or 55 degrees. In some embodiments, the feedstock can be injected at an angle of greater than 5, 10, 15, 20, 25, 30, 35, 40, 45, 50, or 55 degrees. In some embodiments, the feedstock can be injected at an angle of less than 5, 10, 15, 20, 25, 30, 35, 40, 45, 50, or 55 degrees. In alternative embodiments, the feedstock can be injected along the longitudinal axis of the plasma torch.

The microwave radiation can be brought into the plasma applicator 202 through a waveguide 204. The feed material 214 is fed into a plasma chamber 210 and is placed into contact with the plasma generated by the plasma applicator 202. When in contact with the plasma, plasma plume, or plasma exhaust 218, the feed material melts. While still in the plasma chamber 210, the feed material 214 cools and solidifies before being collected into a container 212. Alternatively, the feed material 214 can exit the plasma chamber 210 through the outlet 212 while still in a melted phase and cool and solidify outside the plasma chamber. In some embodiments, a quenching chamber may be used, which may or may not use positive pressure. While described separately from FIG. 1, the embodiments of FIGS. 2A and 2B are understood to use similar features and conditions to the embodiment of FIG. 1.

Figure 3:
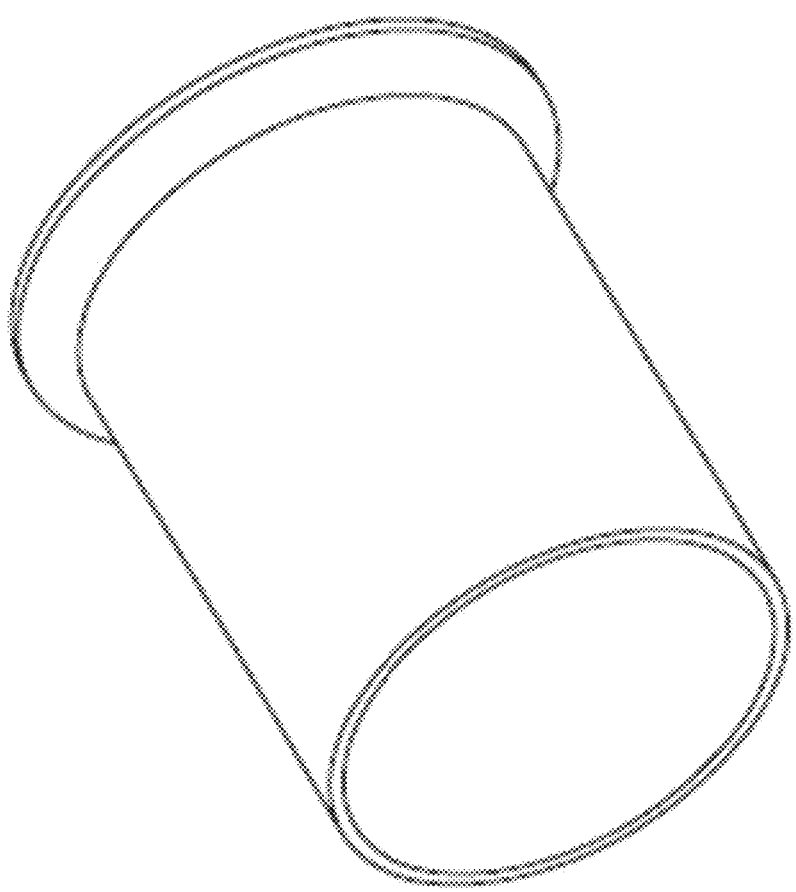
FIG. 3 illustrates an isometric view of an example powder ingress preventor according to some embodiments herein.
Figure 4:
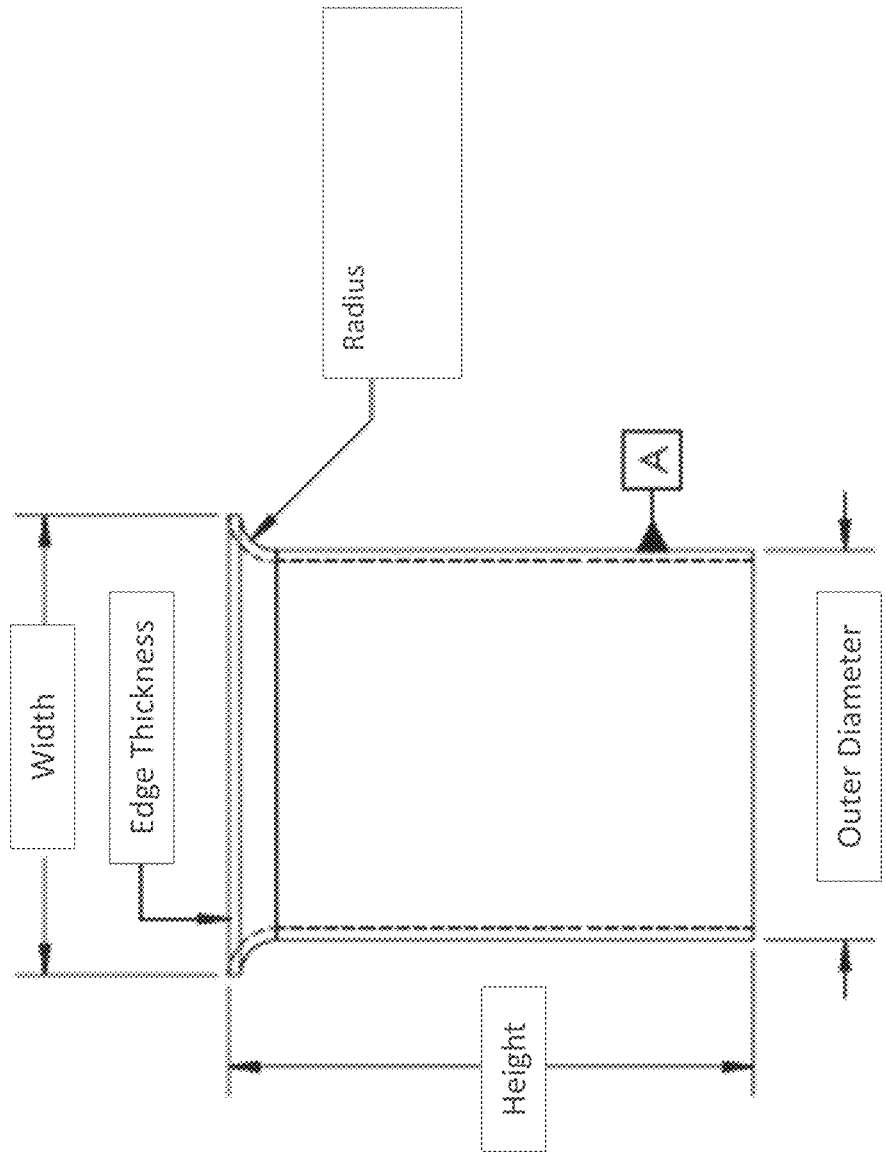
FIG. 4 illustrates a side view of the example powder ingress preventor of FIG. 3.
Figure 5:
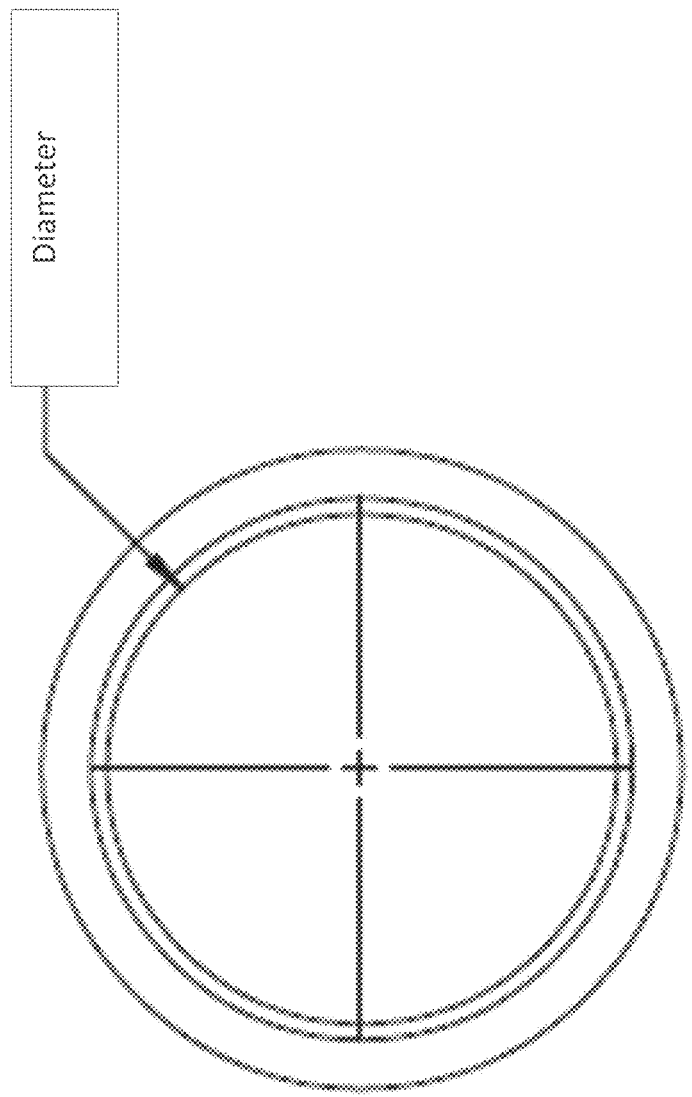
FIG. 5 illustrates a bottom view of the example powder ingress preventor of FIG. 3.

FIG. 3 illustrates an isometric view of an example powder ingress preventor according to some embodiments herein. FIG. 4 illustrates a side view of the example powder ingress preventor of FIG. 3. FIG. 5 illustrates a bottom view of the example powder ingress preventor of FIG. 3.

In some embodiments, the PIP may comprise an assembly comprising a flange (or washer) and a tube. Applicators of different types and manufacturers have different radii on the liner feedthrough. The PIP of FIGS. 3-5 is configured to fit in applicators of all types. For example, the PIP may be dimensioned such that it will fit and self-center in any applicator.

Figure 6:
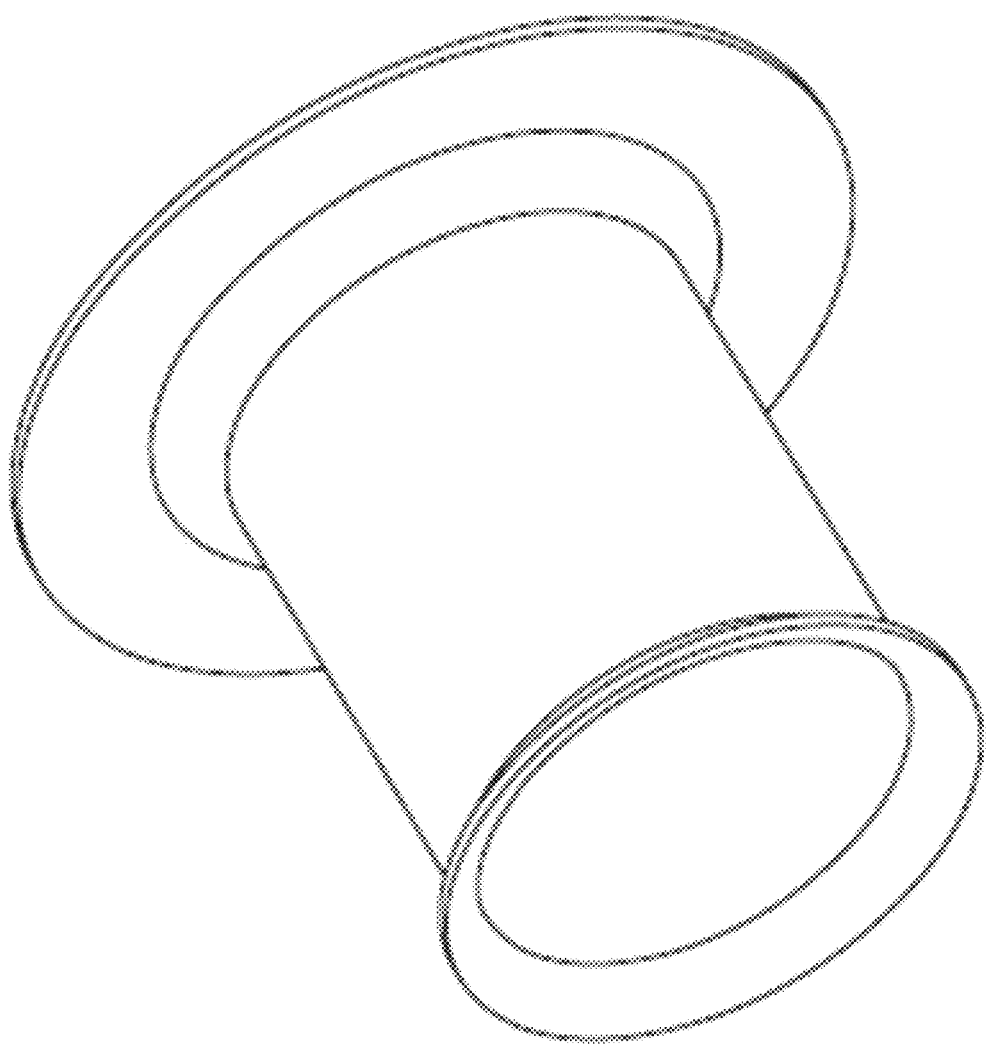
FIG. 6 illustrates an isometric view of another example powder ingress preventor according to some embodiments herein.
Figure 7:
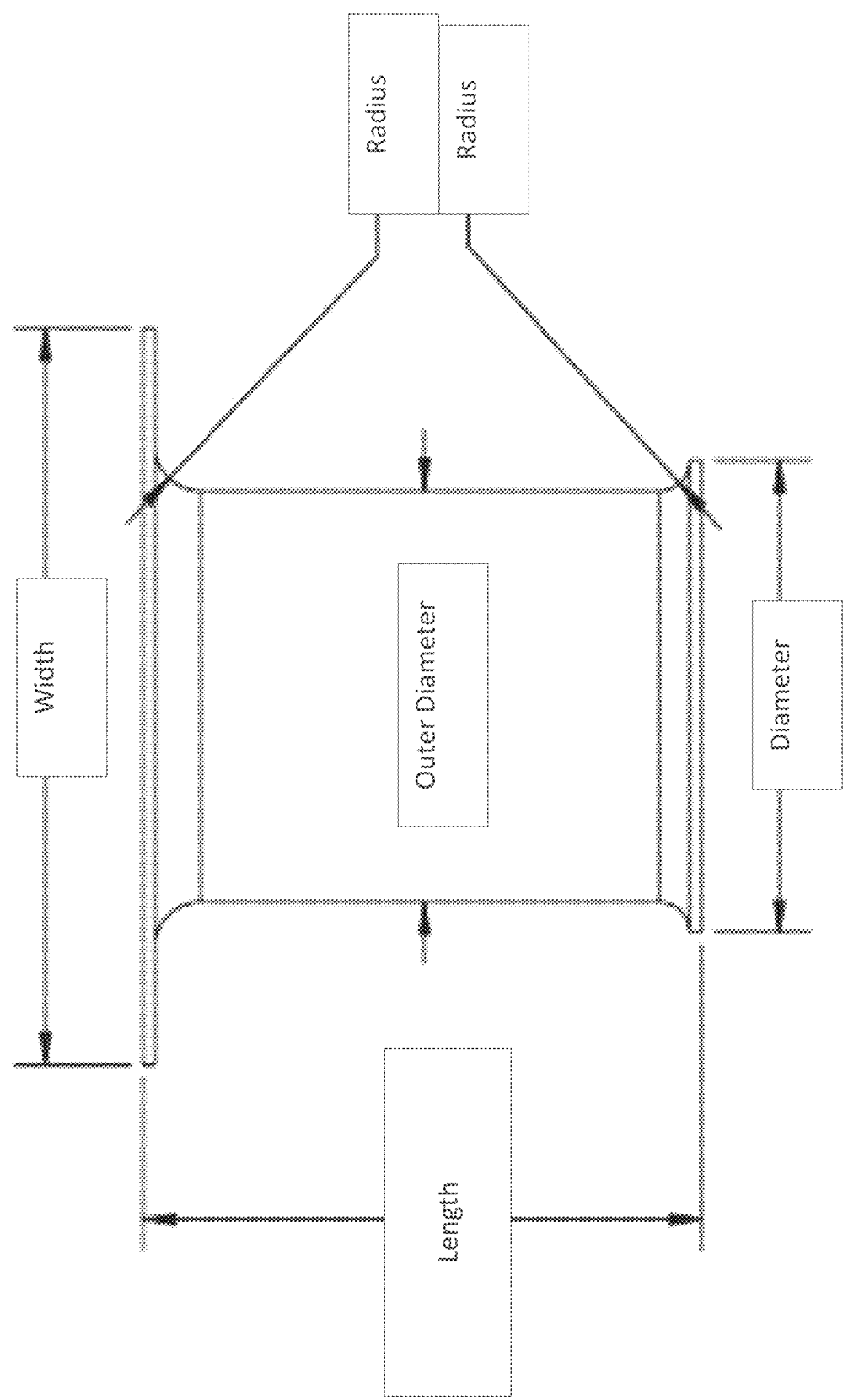
FIG. 7 illustrates a side view of the example powder ingress preventor of FIG. 6.
Figure 8:
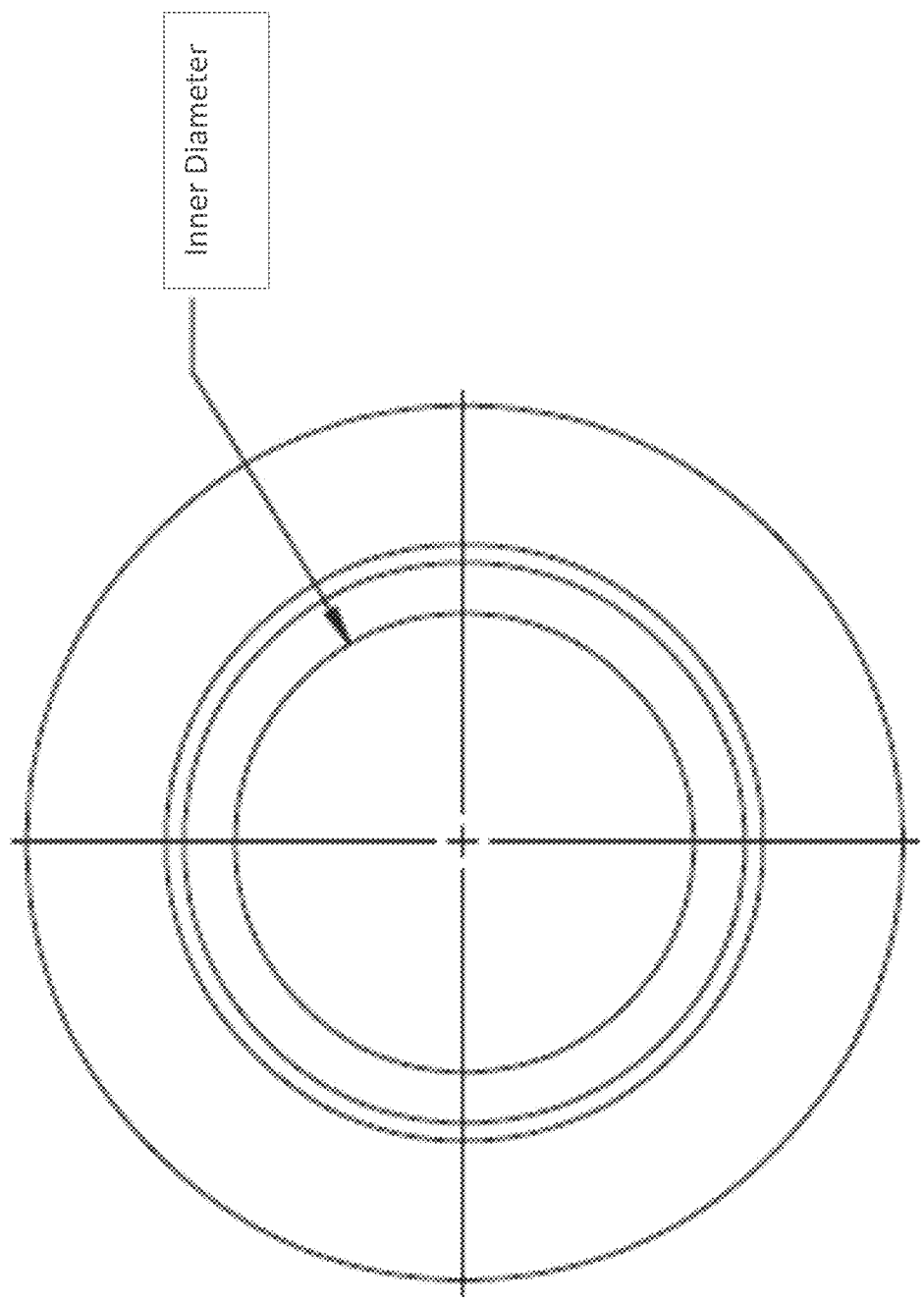
FIG. 8 illustrates a bottom view of the example powder ingress preventor of FIG. 6.
Figure 9:
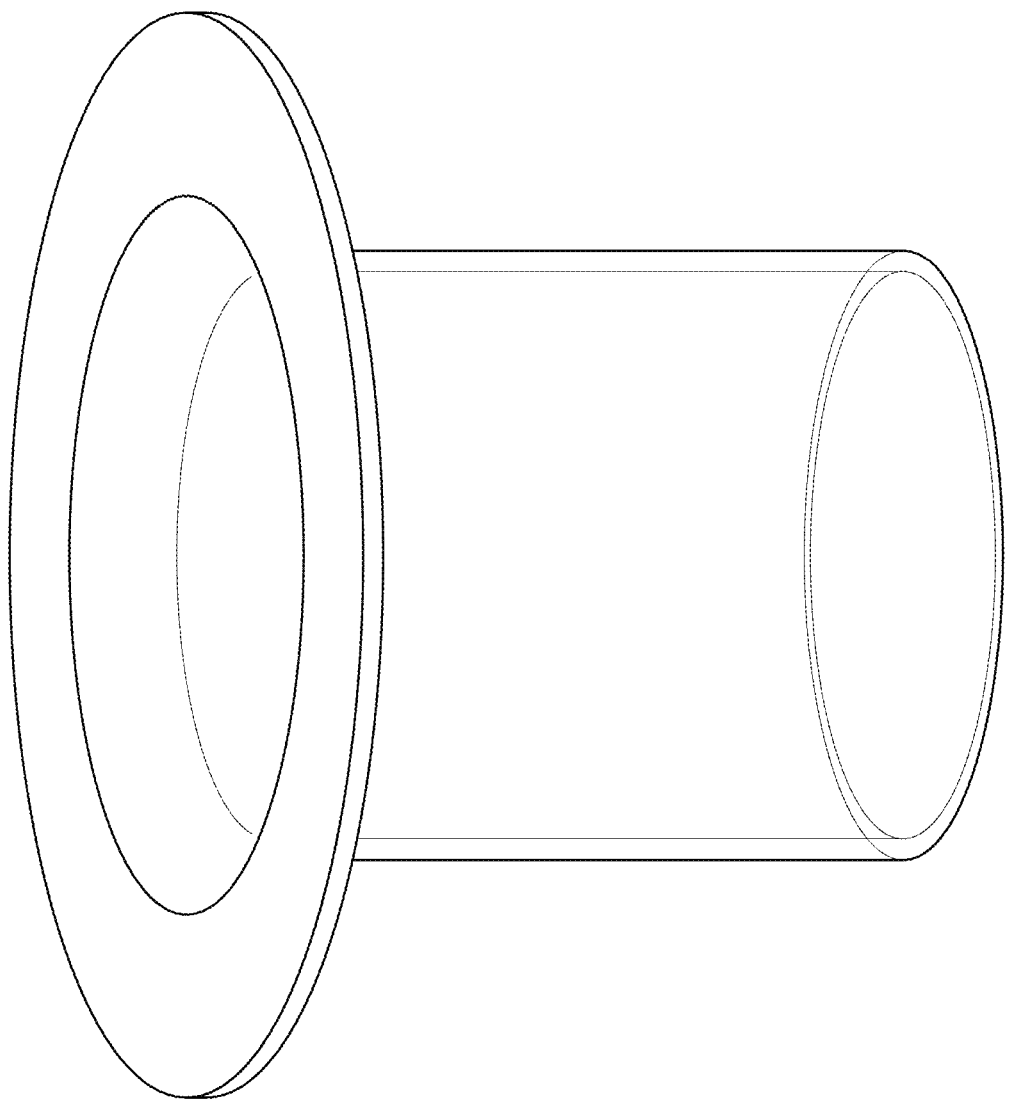
FIG. 9 illustrates an angled side view of the example powder ingress preventor of FIG. 6.

FIG. 6 illustrates an isometric view of another example powder ingress preventor according to some embodiments herein. FIG. 7 illustrates a side view of the example powder ingress preventor of FIG. 6. FIG. 8 illustrates a bottom view of the example powder ingress preventor of FIG. 6. FIG. 9 illustrates an angled side view of the example powder ingress preventor of FIG. 6.

In some embodiments, a PIP may comprise a quartz glass tube. In some embodiments, the PIP may comprise a single, monolithic piece of tube, which may be flared by a glassmaker. In some embodiments, the PIP may comprise a tube portion and a washer portion, wherein the washer portion comprises a bearing surface that contacts the core tube and/or liner of the microwave plasma apparatus. In some embodiments, the PIP may comprise an increased bearing surface, to prevent displacement of the PIP into to the liner. In some embodiments, the geometry of the PIP may add weight while minimizing incidence to the microwave.

In some embodiments, the PIP may comprise a glass-blown part comprising a quartz tube. In some embodiments, the PIP displacement from a worst-case pressure fluctuation may be about 0.426 inches. In some embodiments, the PIP may comprise an increased bearing surface and flared ends to prevent catching on the plasma core tube liner during displacement. In some embodiments, a one-piece, monolithic PIP may be advantageous as there is less risk of the pieces coming apart during pressure fluctuations.

Figure 10:
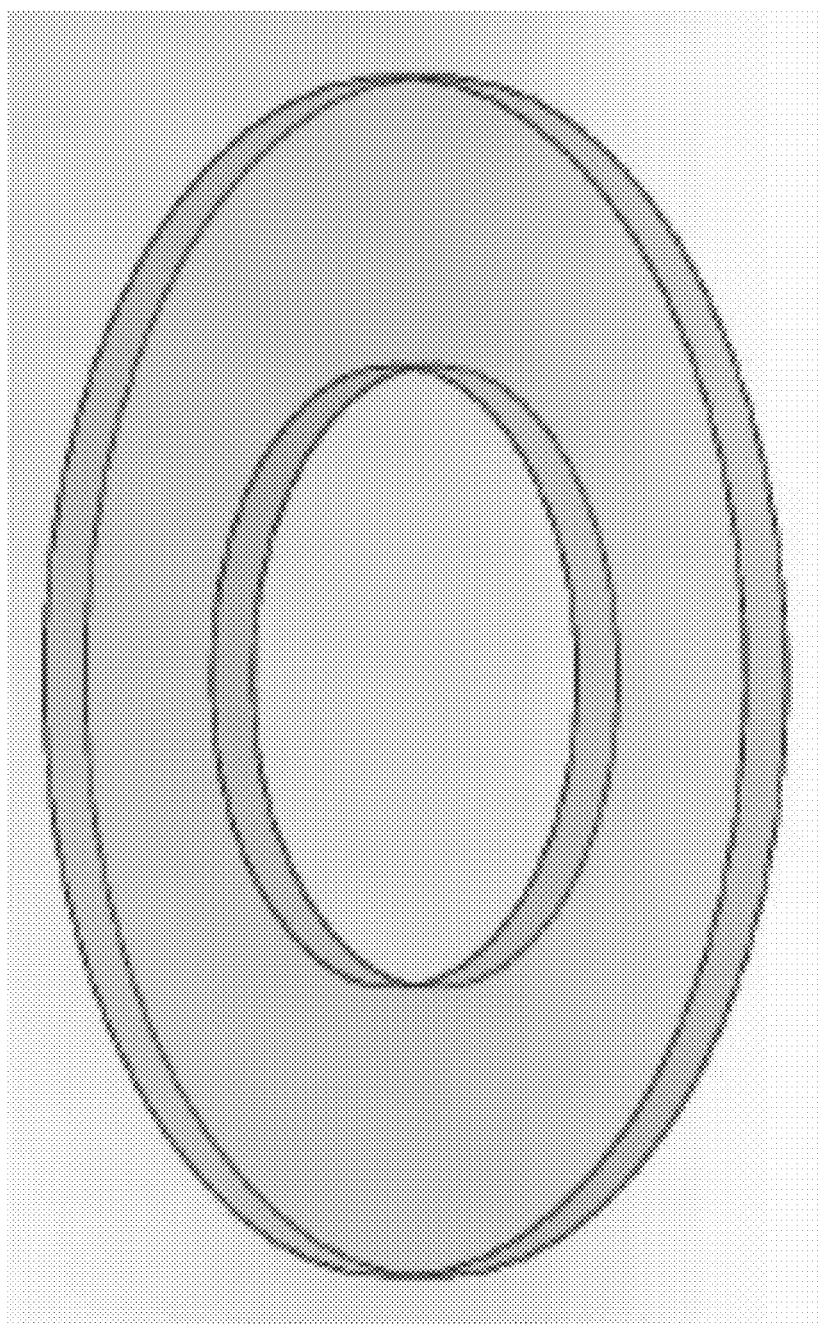
FIG. 10 illustrates another example powder ingress preventor according to some embodiments herein.

FIG. 10 illustrates another example powder ingress preventor according to some embodiments herein. In some embodiments, the PIP may comprise a washer. In some embodiments, the washer may be formed from quartz. In some embodiments, the PIP may comprise a stack of two or more washers. In some embodiments, the PIP may comprise a stack of 2, a stack of 3 washers, or a stack of 4 washers. In some embodiments, the PIP may comprise a larger stack of washers, such as a stack of 5 washers, 10 washers, 15 washers, 20 washers, 25 washers, or any value between the aforementioned values.

In some embodiments, the PIP may comprise an outer diameter and an opening comprising an inner diameter. In some embodiments, the outer diameter may be about 6 inches. In some embodiments, the outer diameter may be about 0.5 inches, about 1 inches, about 1.5 inches, about 2 inches, about 2.5 inches, about 3 inches, about 3.5 inches, about 4 inches, about 4.5 inches, about 5 inches, about 5.5 inches, about 6 inches, about 6.5 inches, about 7 inches, about 7.5 inches, about 8 inches, about 8.5 inches, about 9 inches, about 9.5 inches, about 10 inches, about 10.5 inches, about 11 inches, about 11.5 inches, about 12 inches, about 12.5 inches, or any value between the aforementioned values.

In some embodiments, the PIP may comprise an inner diameter of about 3.138 inches. In some embodiments, the inner diameter may be about 0.25 inches, about 0.75 inches, about 1.25 inches, about 1.75 inches, about 2.25 inches, about 2.75 inches, about 3.25 inches, about 3.75 inches, about 4.25 inches, about 4.75 inches, about 5.25 inches, about 5.75 inches, about 6.25 inches, about 6.75 inches, about 7.25 inches, about 7.75 inches, about 8.25 inches, about 8.75 inches, about 9.25 inches, about 9.75 inches, about 10.25 inches, about 10.75 inches, about 11.25 inches, about 11.75 inches, about 12.25 inches, or any value between the aforementioned values.

In some embodiments, the PIP may comprise a thickness of about 0.25 inches. In some embodiments, the PIP may comprise a thickness of about 0.05 inches, about 0.1 inches, about 0.15 inches, about 0.2 inches, about 0.25 inches, about 0.3 inches, about 0.35 inches, about 0.4 inches, about 0.45 inches, about 0.5 inches, about 0.55 inches, about 0.6 inches, about 0.65 inches, about 0.7 inches, about 0.75 inches, about 0.8 inches, about 0.85 inches, about 0.9 inches, about 0.95 inches, about 1 inches, about 1.05 inches, about 1.1 inches, about 1.15 inches, about 1.2 inches, about 1.25 inches, about 1.3 inches, about 1.35 inches, about 1.4 inches, about 1.45 inches, about 1.5 inches, about 1.55 inches, about 1.6 inches, about 1.65 inches, about 1.7 inches, about 1.75 inches, about 1.8 inches, about 1.85 inches, about 1.9 inches, about 1.95 inches, about 2 inches, about 2.05 inches, about 2.1 inches, about 2.15 inches, about 2.2 inches, about 2.25 inches, about 2.3 inches, about 2.35 inches, about 2.4 inches, about 2.45 inches, about 2.5 inches, or any value between the aforementioned values.

In some embodiments, a worst-case displacement caused by pressure fluctuation may be about 0.236 inches for a stack of 2 washers, about 0.137 inches for a stack of 3 washers, and about 0.087 inches for stack of 4 washers. In some embodiments, a washer PIP design may be immediately sourced, have low deflection for larger stacks of washers, and advantageously create a minimal gap around the liner.

Figure 11:
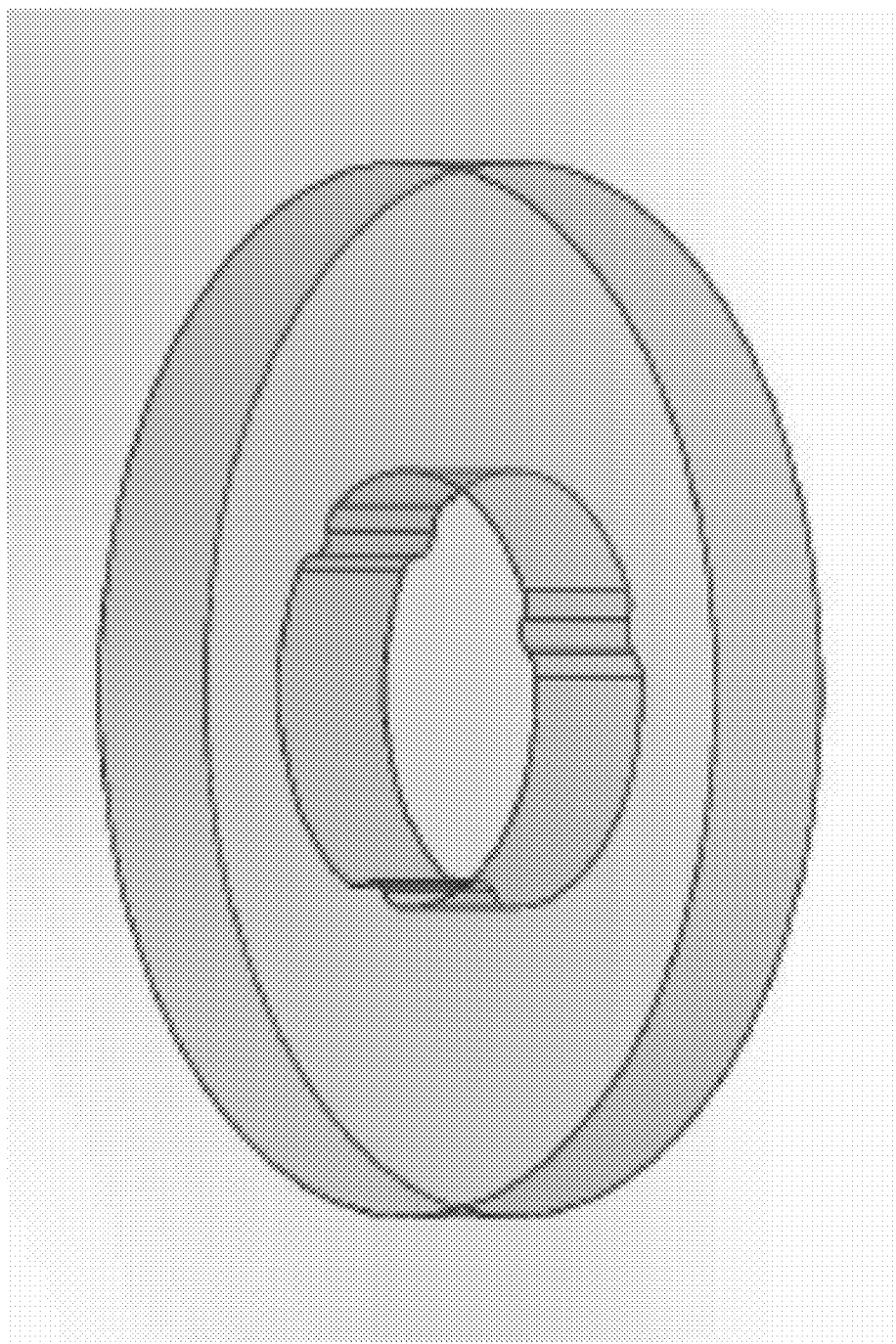
FIG. 11 illustrates another example powder ingress preventor according to some embodiments herein.

FIG. 11 illustrates another example powder ingress preventor according to some embodiments herein. In some embodiments, the PIP may comprise a machined washer comprising quartz. In some embodiments, the washer may be thicker to prevent deflection during pressure fluctuations. In some embodiments, the PIP may comprise one or more centering features along the inner diameter of the washer to assist with centering the washer in the core plasma tube. In some embodiments, the centering features may comprise structures or indentations on the interior diameter. In some embodiments, the centering features may also prevent or mitigate overheating of the washer. In some embodiments, machined PIPs may be manufactured to create a small or nonexistent gap between the PIP and interior wall of the core tube.

In some embodiments, the PIP may comprise a stack of two or more washers. In some embodiments, the PIP may comprise a stack of 2, a stack of 3 washers, or a stack of 4 washers. In some embodiments, the PIP may comprise a larger stack of washers, such as a stack of 5 washers, 10 washers, 15 washers, 20 washers, 25 washers, or any value between the aforementioned values.

In some embodiments, the PIP may comprise an outer diameter and an opening comprising an inner diameter. In some embodiments, the outer diameter may be about 6 inches. In some embodiments, the outer diameter may be about 0.5 inches, about 1 inches, about 1.5 inches, about 2 inches, about 2.5 inches, about 3 inches, about 3.5 inches, about 4 inches, about 4.5 inches, about 5 inches, about 5.5 inches, about 6 inches, about 6.5 inches, about 7 inches, about 7.5 inches, about 8 inches, about 8.5 inches, about 9 inches, about 9.5 inches, about 10 inches, about 10.5 inches, about 11 inches, about 11.5 inches, about 12 inches, about 12.5 inches, or any value between the aforementioned values.

In some embodiments, the PIP may comprise an inner diameter of about 3.138 inches. In some embodiments, the inner diameter may be about 0.25 inches, about 0.75 inches, about 1.25 inches, about 1.75 inches, about 2.25 inches, about 2.75 inches, about 3.25 inches, about 3.75 inches, about 4.25 inches, about 4.75 inches, about 5.25 inches, about 5.75 inches, about 6.25 inches, about 6.75 inches, about 7.25 inches, about 7.75 inches, about 8.25 inches, about 8.75 inches, about 9.25 inches, about 9.75 inches, about 10.25 inches, about 10.75 inches, about 11.25 inches, about 11.75 inches, about 12.25 inches, or any value between the aforementioned values.

In some embodiments, the PIP may comprise a thickness of about 0.25 inches. In some embodiments, the PIP may comprise a thickness of about 0.05 inches, about 0.1 inches, about 0.15 inches, about 0.2 inches, about 0.25 inches, about 0.3 inches, about 0.35 inches, about 0.4 inches, about 0.45 inches, about 0.5 inches, about 0.55 inches, about 0.6 inches, about 0.65 inches, about 0.7 inches, about 0.75 inches, about 0.8 inches, about 0.85 inches, about 0.9 inches, about 0.95 inches, about 1 inches, about 1.05 inches, about 1.1 inches, about 1.15 inches, about 1.2 inches, about 1.25 inches, about 1.3 inches, about 1.35 inches, about 1.4 inches, about 1.45 inches, about 1.5 inches, about 1.55 inches, about 1.6 inches, about 1.65 inches, about 1.7 inches, about 1.75 inches, about 1.8 inches, about 1.85 inches, about 1.9 inches, about 1.95 inches, about 2 inches, about 2.05 inches, about 2.1 inches, about 2.15 inches, about 2.2 inches, about 2.25 inches, about 2.3 inches, about 2.35 inches, about 2.4 inches, about 2.45 inches, about 2.5 inches, or any value between the aforementioned values.

Figure 12:
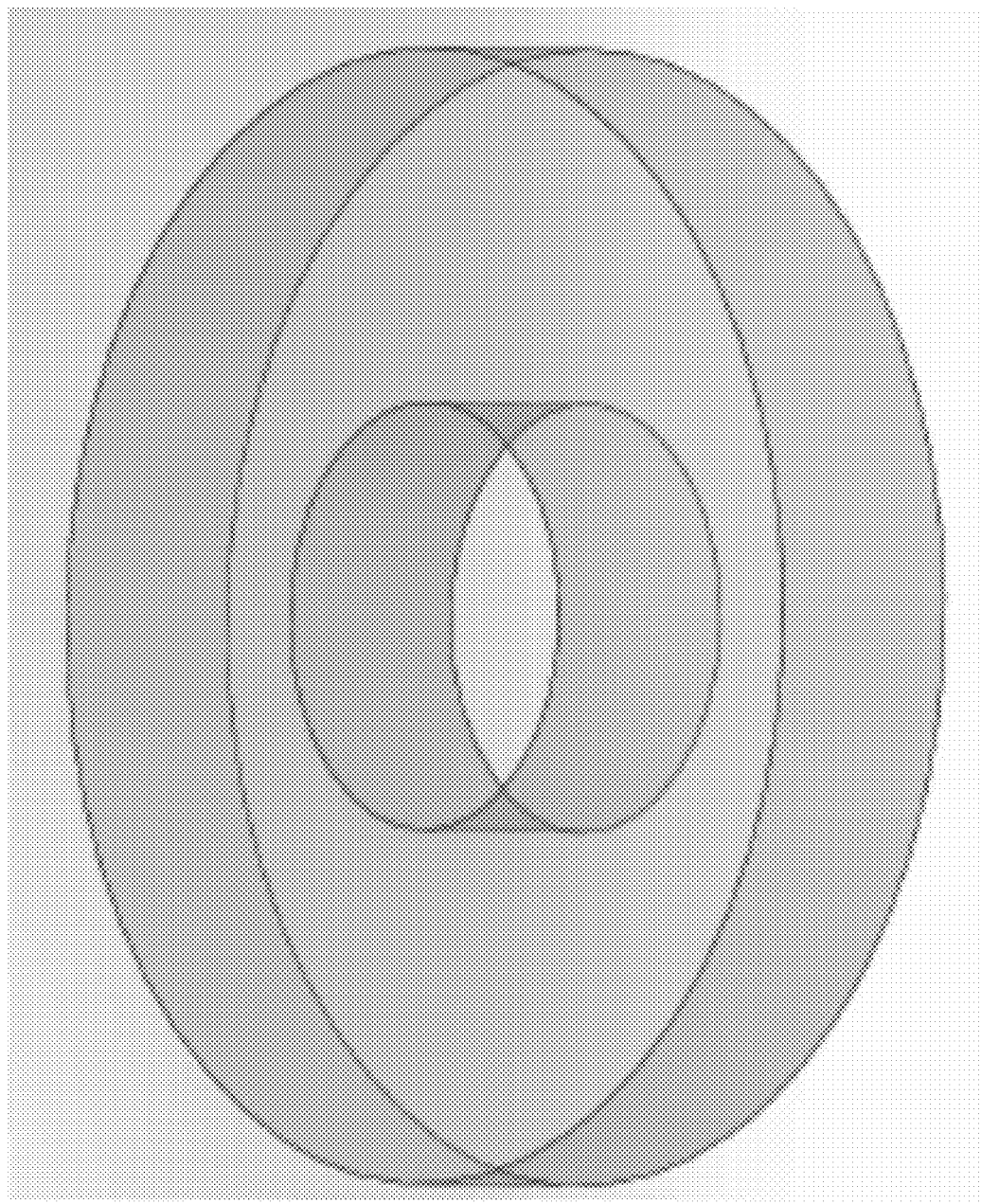
FIG. 12 illustrates another example powder ingress preventor according to some embodiments herein.

FIG. 12 illustrates another example powder ingress preventor according to some embodiments herein. In some embodiments, the washer PIP may comprise a larger outer diameter. In some embodiments, the outer diameter may be about 8 inches.

Figure 13:
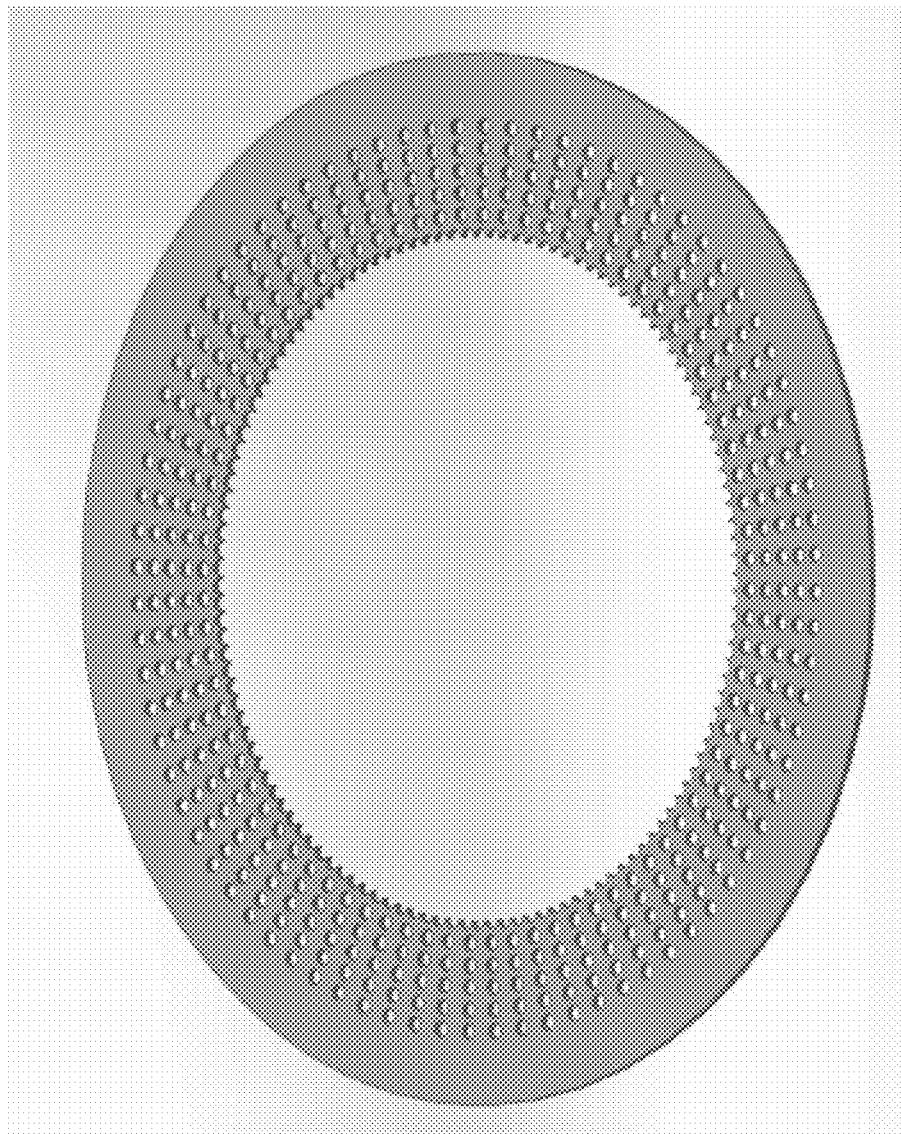
FIG. 13 illustrates another example powder ingress preventor according to some embodiments herein.

FIG. 13 illustrates another example powder ingress preventor according to some embodiments herein. In some embodiments, the PIP may comprise an annular ring with a plurality of holes through the annular ring. In some embodiments, the plurality of holes form one or more concentric circles through a surface of the washer. In some embodiments, the annular ring may comprise one or more cutouts or serrations on the interior opening of the ring.

Figure 14:
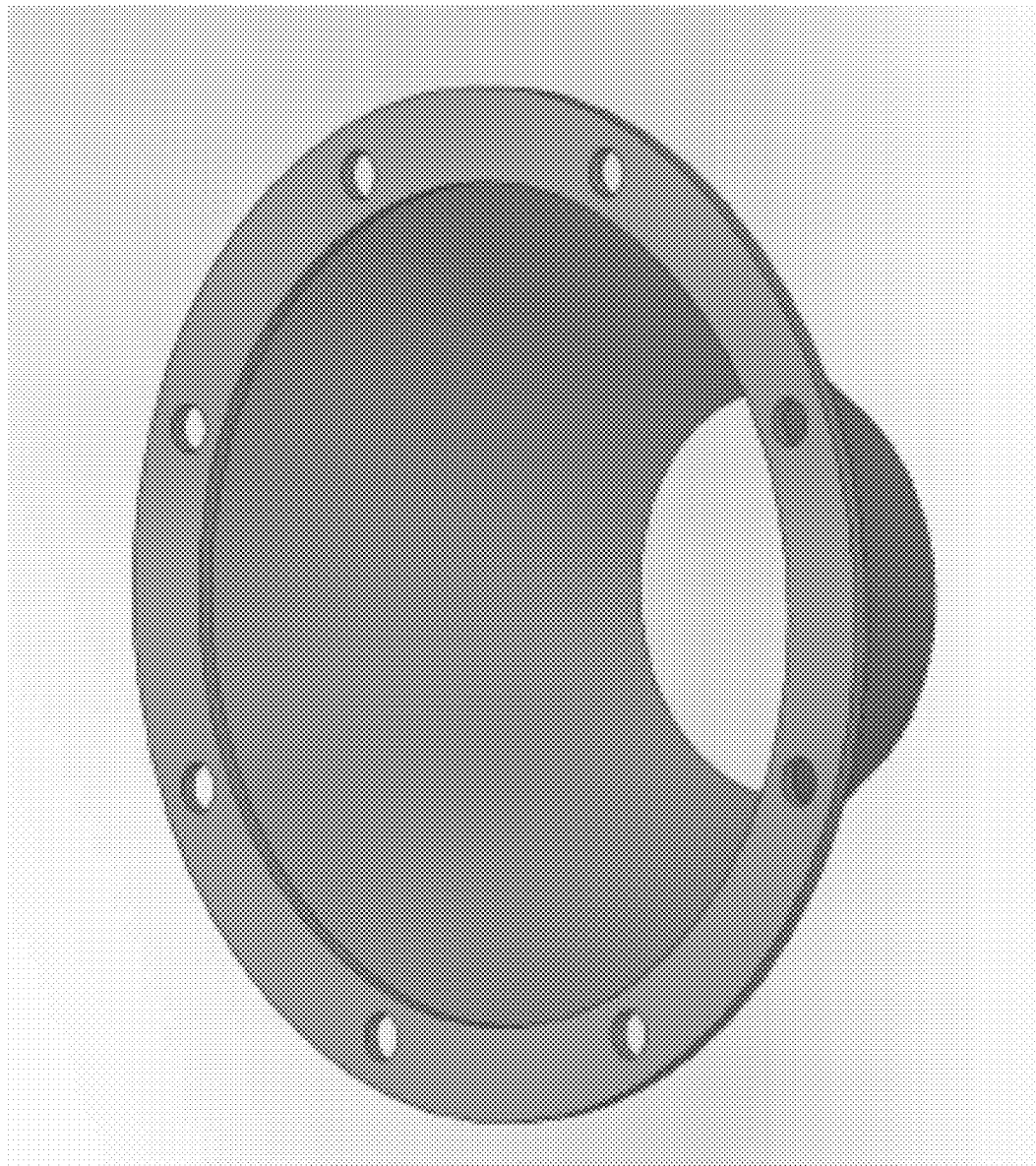
FIG. 14 illustrates another example powder ingress preventor according to some embodiments herein.
Figure 15:
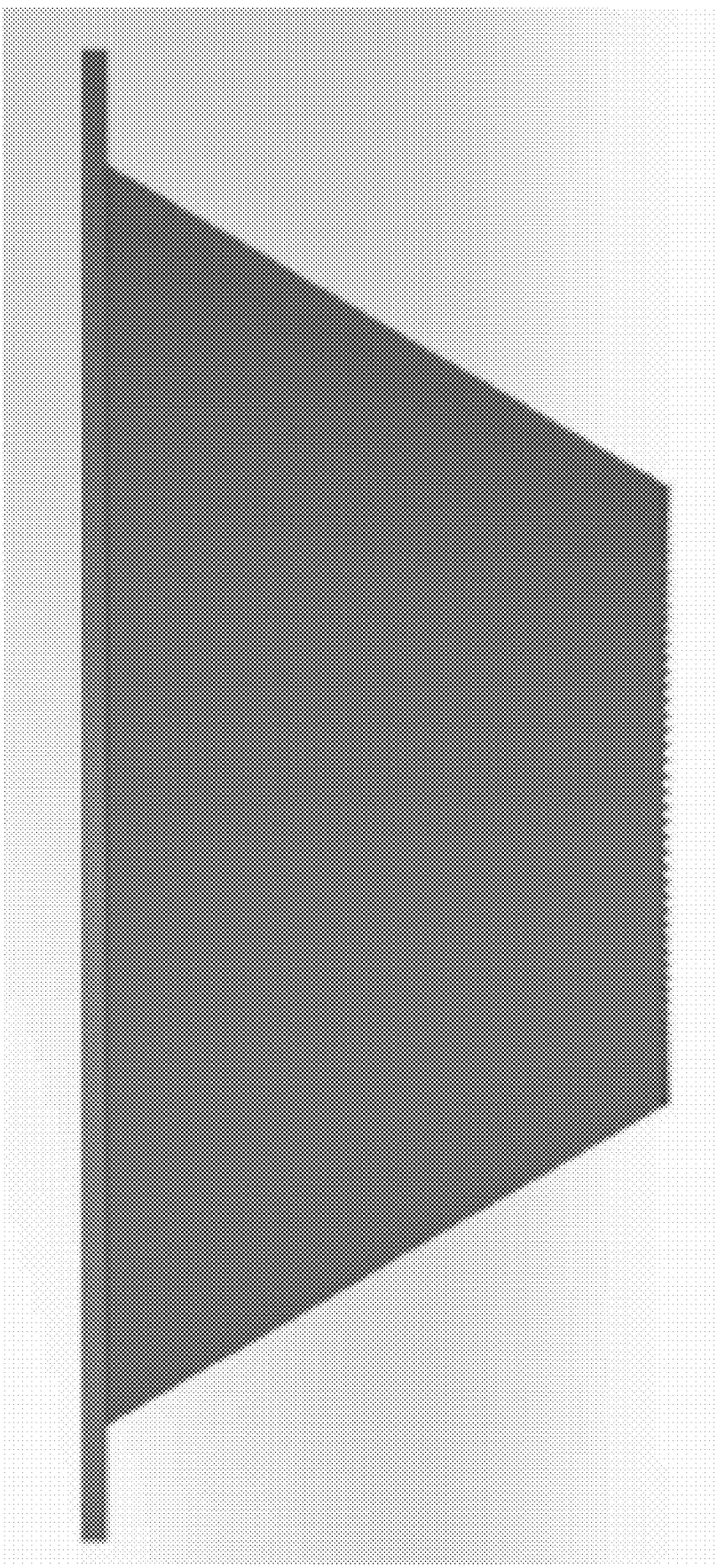
FIG. 15 illustrates a side view of the example powder ingress preventor of FIG. 14.

FIG. 14 illustrates another example powder ingress preventor according to some embodiments herein. FIG. 15 illustrates a side view of the example powder ingress preventor of FIG. 14. In some embodiments, the PIP may comprise an inverted cone shape with a rim. In some embodiments, the rim may comprise one or more holes through the ring. In some embodiments, the inverted cone may extend downward and radially inward to an opening at the bottom of the cone. In some embodiments, the opening may comprise one or more cutouts or serrations.

Figure 16B:
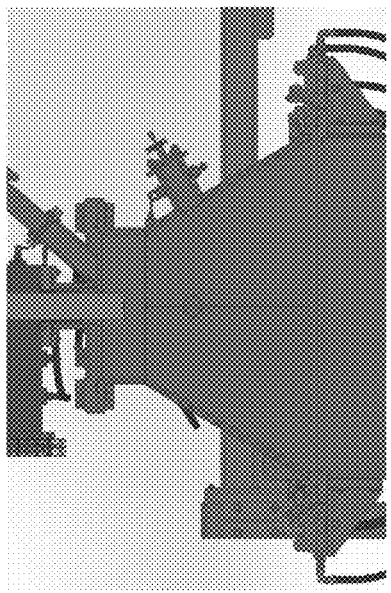
FIG. 16A-16C illustrate an example microwave plasma apparatus comprising a powder ingress preventor according to some embodiments herein.
Figure 16C:
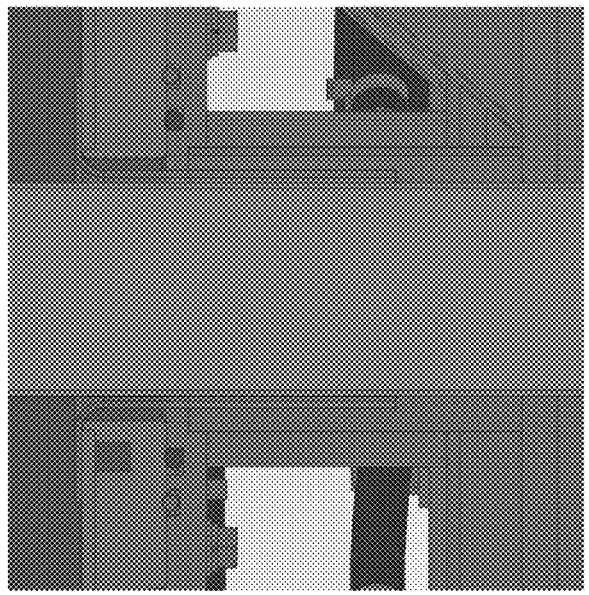
Figure 16A:
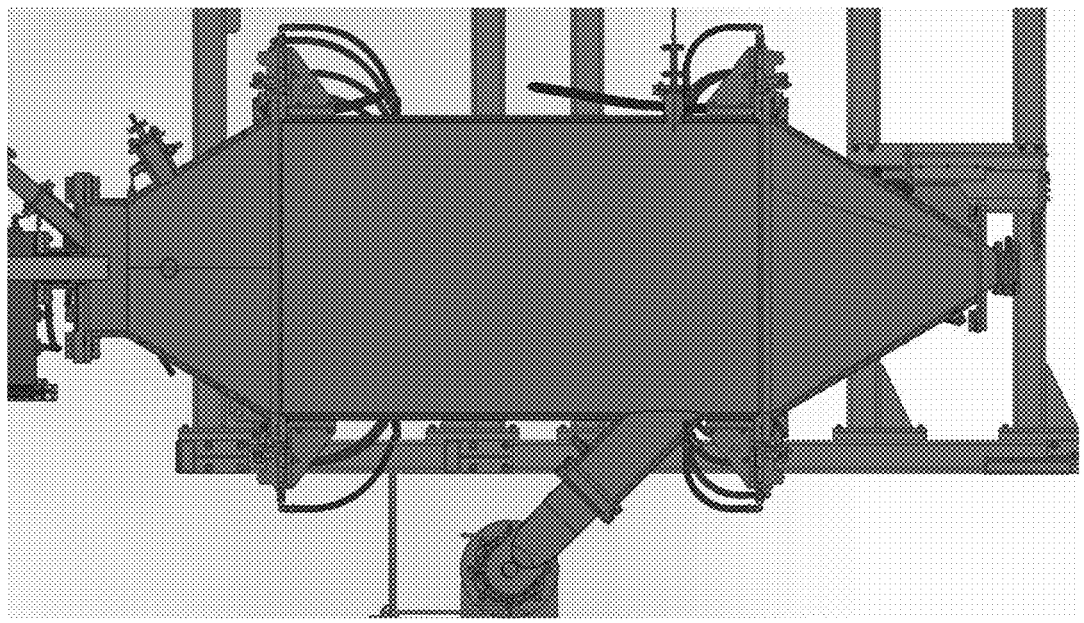
Figure 17:
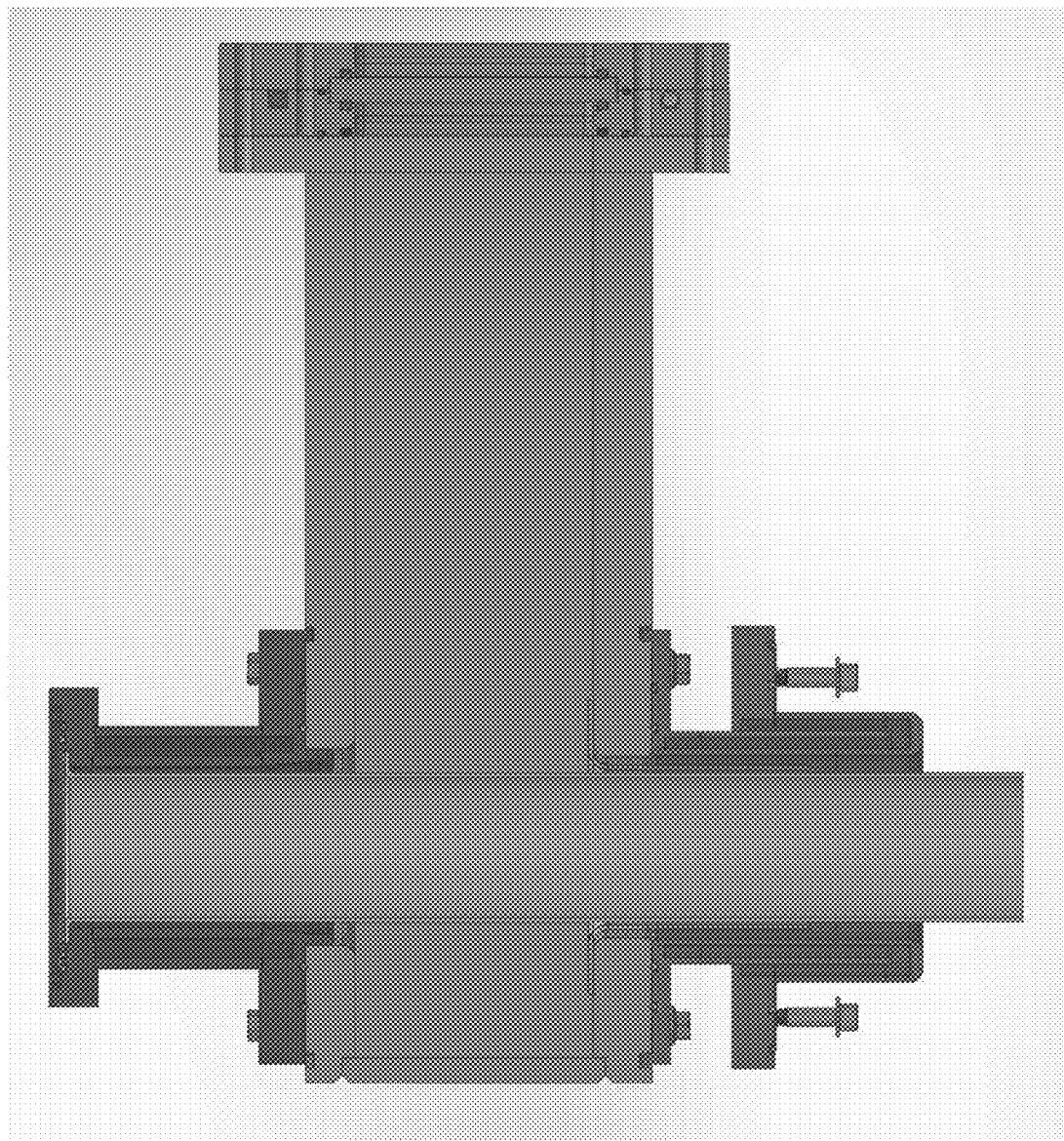
FIG. 17 illustrates an example microwave plasma apparatus comprising a waveguide and plasma applicator with a powder ingress preventor according to some embodiments herein.

FIG. 16A-16C illustrate an example microwave plasma apparatus comprising a powder ingress preventor according to some embodiments herein. FIG. 17 illustrates an example microwave plasma apparatus comprising a waveguide and plasma applicator with a powder ingress preventor according to some embodiments herein. As noted above, in some embodiments, the PIP may comprise a sleeve piece laying in the applicator around the liner.

Figure 18:
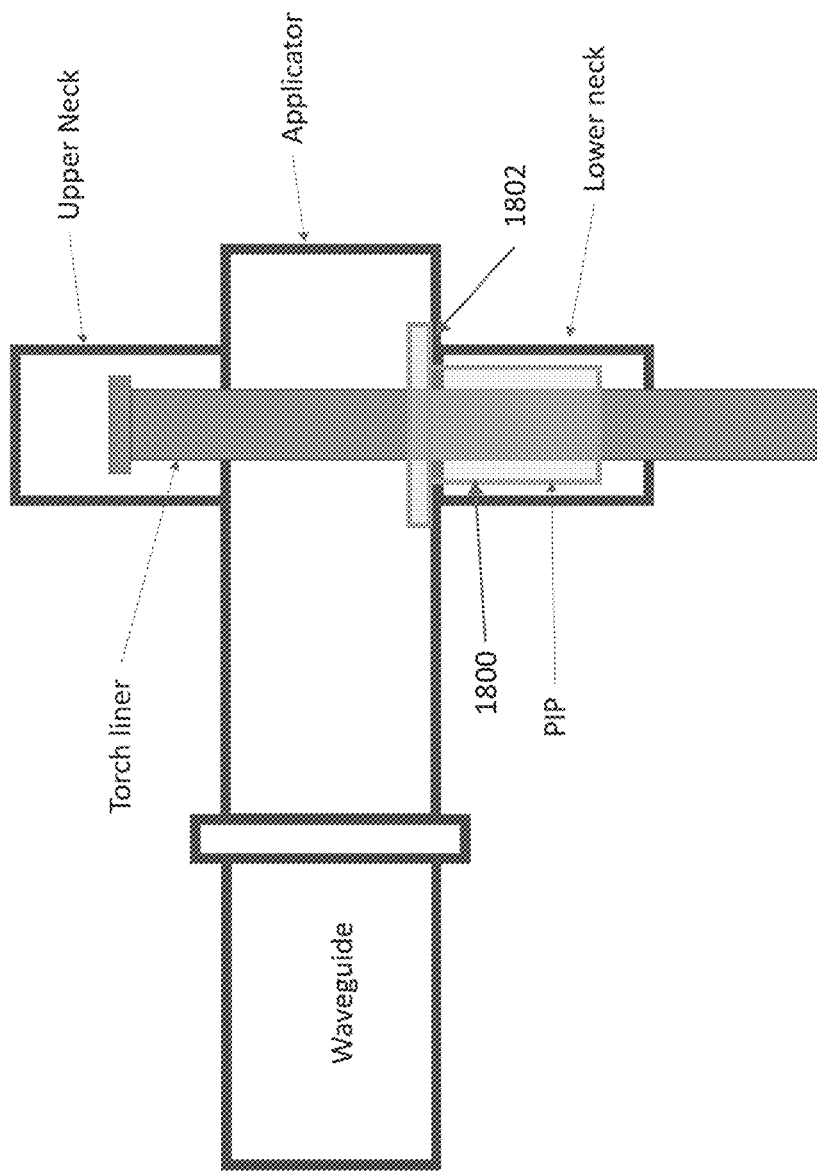
FIG. 18 illustrates an example microwave plasma apparatus comprising a waveguide and plasma applicator with a powder ingress preventor according to some embodiments herein.

FIG. 18 illustrates an example microwave plasma apparatus comprising a waveguide and plasma applicator with a powder ingress preventor according to some embodiments herein. As illustrated in FIG. 18, a microwave plasma apparatus may comprise a core plasma tube comprising an upper neck and a lower neck, separated by a plasma applicator in communication with a waveguide configured to transmit microwave power from a microwave power source. In some embodiments, a torch liner may be provided within the core plasma tube and extending from the upper neck through the applicator and lower neck into the reaction chamber. In some embodiments, a PIP may be provided surrounding the torch liner within the applicator and/or lower neck of the core plasma tube. In some embodiments, the PIP may comprise a ring structure 1800 comprising a bearing surface 1802 and a tube. In some embodiments, the bearing surface 1802 may contact a lower surface of the applicator, while the tube may comprise an annular ring surrounding the torch liner. In some embodiments, the tube may be concentric with the core plasma tube and the torch liner. In some embodiments, the tube may comprise an opening or annulus with a diameter greater than the diameter of the torch liner, such that a gap is provided between the torch liner and PIP tube. In some embodiments, the tube of the PIP ring structure 1800 may extend downward from the applicator into the lower neck of the core plasma tube.

EXAMPLES

Example 1

The PIP illustrated in FIGS. 6-8 was evaluated using an $O_2$ plasma at 30 kW power and a pressure of about 90 psi (about 4654.34 Torr) to about 120 psi (about 6205.79 Torr), with about 20 kg of material feed input. After each test, the plasma apparatus was inspected for powder ingress. Compared to a system without a PIP, powder ingress was greatly reduced or entirely eliminated. The outer surface of the PIP had a heavy coating of powder, while the inner surface showed no signs of powder ingress. The PIP showed no signs of damage. In some embodiments, installation of a PIP in the microwave plasma apparatus requires no retuning of the plasma apparatus or process.

Example 2

A test was conducted using 24 kW to 34 kW extended runs with Tungsten-Rhenium powder having a particle size of about 5 µm to 25 µm using the PIP of FIGS. 6-8. The powder was fed at 0.5-3.0 kg/hour through a single injector. Waveguide gas was flown at 1.5 scfm. Adding a PIP to the plasma apparatus resulted in no change in plasma stability, and no change in reflected power without additional tuning of the plasma. The PIP collected a large amount of powder and powder in the plasma applicator was drastically reduced or fully eliminated. There was a large amount of powder buildup on the inside of PIP, and on the outside of liner where the PIP overlapped.

There was more powder buildup in the lower neck of the PIP. The buildup on the interior was textured instead of a typical smooth buildup. There was increased plasma arcing on the liner.

Additional Embodiments

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than restrictive sense.

Indeed, although this invention has been disclosed in the context of certain embodiments and examples, it will be understood by those skilled in the art that the invention extends beyond the specifically disclosed embodiments to other alternative embodiments and/or uses of the invention and obvious modifications and equivalents thereof. In addition, while several variations of the embodiments of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the embodiments of the disclosed invention. Any methods disclosed herein need not be performed in the order recited. Thus, it is intended that the scope of the invention herein disclosed should not be limited by the particular embodiments described above.

It will be appreciated that the systems and methods of the disclosure each have several innovative aspects, no single one of which is solely responsible or required for the desirable attributes disclosed herein. The various features and processes described above may be used independently of one another or may be combined in several ways. All possible combinations and subcombinations are intended to fall within the scope of this disclosure.

Certain features that are described in this specification in the context of separate embodiments also may be implemented in combination in a single embodiment. Conversely, various features that are described in the context of a single embodiment also may be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination. No single feature or group of features is necessary or indispensable to each and every embodiment.

It will also be appreciated that conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. In addition, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one more example processes in the form of a flowchart. However, other operations that are not depicted may be incorporated in the example methods and processes that are schematically illustrated. For example, one or more additional operations may be performed before, after, simultaneously, or between any of the illustrated operations. Additionally, the operations may be rearranged or reordered in other embodiments. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products. Additionally, other embodiments are within the scope of the following claims. In some cases, the actions recited in the claims may be performed in a different order and still achieve desirable results.

Further, while the methods and devices described herein may be susceptible to various modifications and alternative forms, specific examples thereof have been shown in the drawings and are herein described in detail. It should be understood, however, that the invention is not to be limited to the particular forms or methods disclosed, but, to the contrary, the invention is to cover all modifications, equivalents, and alternatives falling within the spirit and scope of the various implementations described and the appended claims. Further, the disclosure herein of any particular feature, aspect, method, property, characteristic, quality, attribute, element, or the like in connection with an implementation or embodiment can be used in all other implementations or embodiments set forth herein. Any methods disclosed herein need not be performed in the order recited. The methods disclosed herein may include certain actions taken by a practitioner; however, the methods can also include any third-party instruction of those actions, either expressly or by implication. The ranges disclosed herein also encompass any and all overlap, sub-ranges, and combinations thereof. Language such as "up to," "at least," "greater than," "less than," "between," and the like includes the number recited. Numbers preceded by a term such as "about" or "approximately" include the recited numbers and should be interpreted based on the circumstances (e.g., as accurate as reasonably possible under the circumstances, for example ±5%, ±10%, ±15%, etc.). For example, "about 3.5 mm" includes "3.5 mm." Phrases preceded by a term such as "substantially" include the recited phrase and should be interpreted based on the circumstances (e.g., as much as reasonably possible under the circumstances). For example, "substantially constant" includes "constant." Unless stated otherwise, all measurements are in standard conditions including temperature and pressure.

As used herein, a phrase referring to "at least one of" a list of items refers to any combination of those items, including single members. As an example, "at least one of: A, B, or C" is intended to cover: A, B, C, A and B, A and C, B and C, and A, B, and C. Conjunctive language such as the phrase "at least one of X, Y and Z," unless specifically stated otherwise, is otherwise understood with the context as used in general to convey that an item, term, etc. may be at least one of X, Y or Z. Thus, such conjunctive language is not generally intended to imply that certain embodiments require at least one of X, at least one of Y, and at least one of Z to each be present. The headings provided herein, if any, are for convenience only and do not necessarily affect the scope or meaning of the devices and methods disclosed herein.

Accordingly, the claims are not intended to be limited to the embodiments shown herein but are to be accorded the widest scope consistent with this disclosure, the principles and the novel features disclosed herein.

What is claimed is:

1. A microwave plasma apparatus for processing a material, comprising:
    a core plasma tube;
    a liner located within and concentric with the core plasma tube;
    a plasma applicator; and
    a ring structure located between the core plasma tube and the liner, the ring structure concentric with the core plasma tube and the liner, and the ring structure comprising:
        a bearing surface, the bearing surface contacting a bottom surface of the plasma applicator; and
        an opening, the opening surrounding the liner and having a diameter greater than an outer diameter of the liner.

2. The microwave plasma apparatus of claim 1, wherein the ring structure is formed of glass or quartz.

3. The microwave plasma apparatus of claim 1, wherein the ring structure comprises a single piece of material.

4. The microwave plasma apparatus of claim 1, wherein the ring structure comprises an assembly comprising two or more pieces, wherein the assembly comprises a first piece comprising a flange and a second piece comprising a tube.

5. The microwave plasma apparatus of claim 1, wherein the ring structure comprises a washer, wherein the washer comprises a plurality of holes.

6. The microwave plasma apparatus of claim 5, wherein the plurality of holes form one or more concentric circles on a surface of the washer.

7. The microwave plasma apparatus of claim 1, wherein the opening comprises one or more indentations or serrations.

8. The microwave plasma apparatus of claim 1, wherein the ring structure comprises an inverted cone, wherein the inverted cone comprises a rim, the rim comprising one or more holes formed through the rim, wherein the inverted cone comprises a serrated bottom opening.

9. The microwave plasma apparatus of claim 8, wherein the inverted cone comprises a serrated bottom opening.

10. A ring structure for preventing powder ingress within a microwave plasma apparatus, the ring structure comprising:
    a bearing surface, the bearing surface contacting a lower surface of a plasma applicator of the microwave plasma apparatus; and
    an opening, the opening the opening surrounding a liner of the microwave plasma apparatus and having a diameter greater than an outer diameter of the liner.

11. The ring structure of claim 10, wherein the ring structure is formed of glass or quartz.

12. The ring structure of claim 10, wherein the ring structure comprises a single piece of material.

13. The ring structure of claim 10, wherein the ring structure comprises an assembly comprising two or more pieces, wherein the assembly comprises a first piece comprising a flange and a second piece comprising a tube.

14. The ring structure of claim 10, wherein the ring structure comprises a washer, wherein the washer comprises a plurality of holes, wherein the plurality of holes form one or more concentric circles on a surface of the washer.

15. The ring structure of claim 10, wherein the opening comprises one or more indentations or serrations.

16. The ring structure of claim 10, wherein the ring structure comprises an inverted cone, the rim comprising one or more holes formed through the rim, wherein the inverted cone comprises a serrated bottom opening.

* * * * *